United States Patent [19]

Sasaki

[11] Patent Number: 4,625,391

[45] Date of Patent: Dec. 2, 1986

[54] SEMICONDUCTOR DEVICE AND METHOD FOR MANUFACTURING THE SAME

[75] Inventor: Yoshitaka Sasaki, Yokohama, Japan

[73] Assignee: Tokyo Shibaura Denki Kabushiki Kaisha, Japan

[21] Appl. No.: 389,939

[22] Filed: Jun. 18, 1982

[30] Foreign Application Priority Data

Jun. 23, 1981 [JP] Japan .................................. 56-96908
Oct. 7, 1981 [JP] Japan ................................. 56-159841

[51] Int. Cl.⁴ .................... H01L 21/304; H01L 21/44
[52] U.S. Cl. ...................................... 29/589; 29/571; 29/576 R; 29/578; 148/1.5; 148/DIG. 8; 148/DIG. 117; 148/DIG. 122; 357/47; 357/59; 357/71
[58] Field of Search ................. 29/571, 578, 589, 579, 29/576 R, 576 J; 148/1.5, 187, DIG. 8, DIG. 116, DIG 117, DIG. 122, DIG. 123, DIG. 143; 357/40, 41, 47, 59, 71

[56] References Cited

U.S. PATENT DOCUMENTS

| | | | |
|---|---|---|---|
| 3,940,288 | 2/1976 | Takagi et al. | 148/DIG. 143 X |
| 4,078,963 | 3/1978 | Symersky | 156/652 |
| 4,184,909 | 1/1980 | Chang et al. | 156/643 |
| 4,234,362 | 11/1980 | Riseman | 29/528 X |
| 4,251,571 | 2/1981 | Garbarino et al. | 427/89 |
| 4,352,238 | 10/1982 | Shimbo | 29/579 |

FOREIGN PATENT DOCUMENTS 1475277 6/1977 United Kingdom .

OTHER PUBLICATIONS

IBM Technical Disclosure Bulletin, vol. 17, No. 6 Nov. 1974.

Primary Examiner—Brian E. Hearn
Assistant Examiner—David A. Hey
Attorney, Agent, or Firm—Finnegan, Henderson, Farabow, Garrett & Dunner

[57] ABSTRACT

A method of forming electric conductive patterns comprising the steps of forming first conductive patterns on a semiconductor substrate directly or through an insulating layer with first insulating film being formed thereon, selectively forming second conductive patterns, forming insulation layers on side surfaces of said second conductive patterns, thereby electrically insulating said second conductive patterns from said first conductive patterns through said insulation layers in a self-aligned manner. An semiconductor device having electric conductive patterns formed by above-mentioned method.

4 Claims, 75 Drawing Figures

F I G. 4(a)
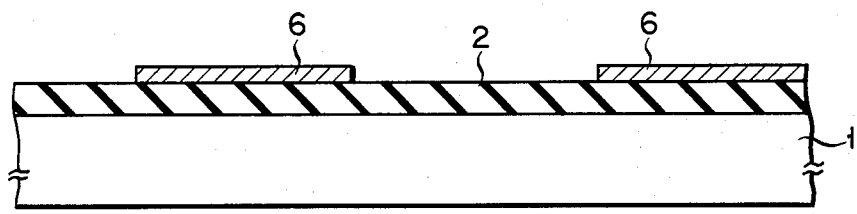
F I G. 4(b)
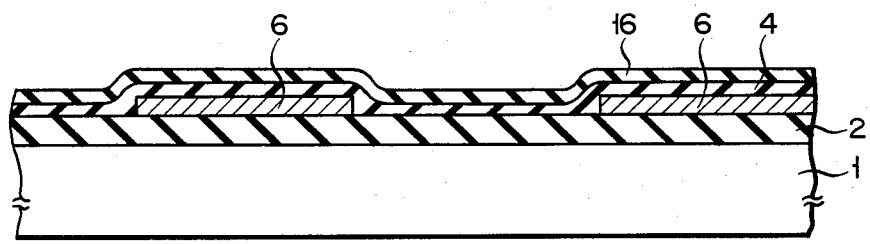
F I G. 4(c)
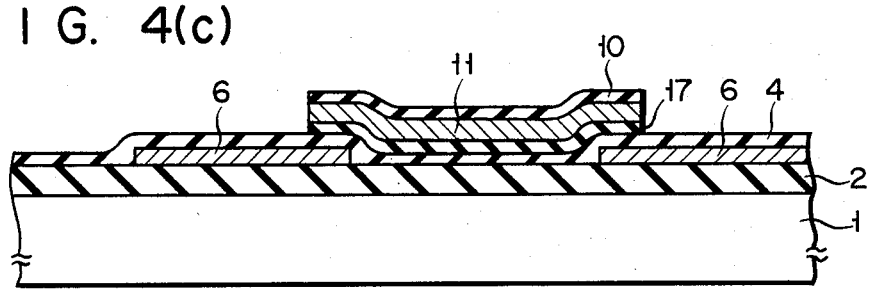
F I G. 4(d)
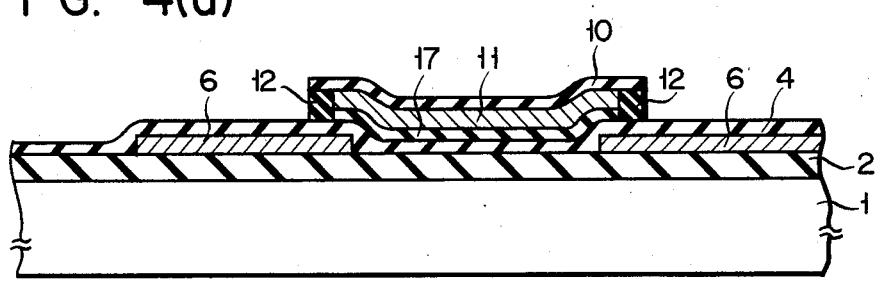

F I G. 4(e)
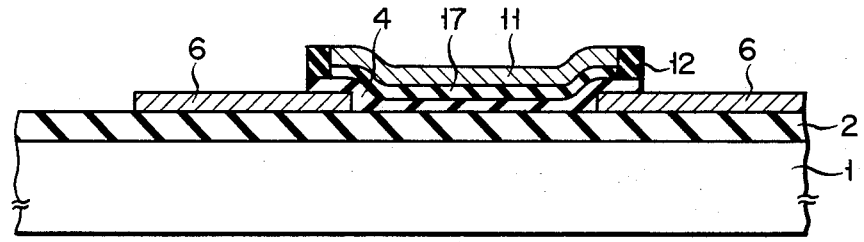
F I G. 4(f)
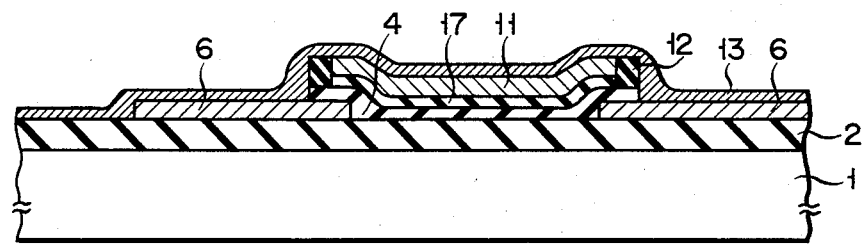
F I G. 4(g)
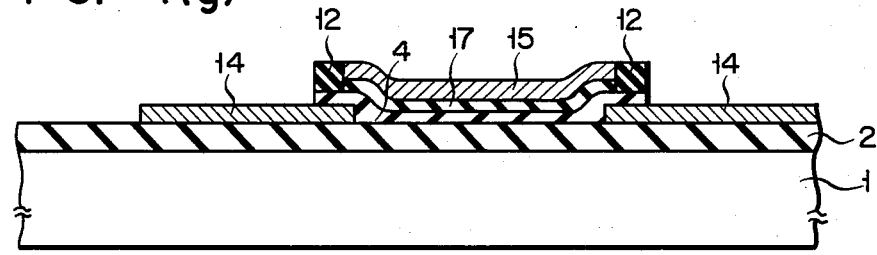

F I G. 6(e)
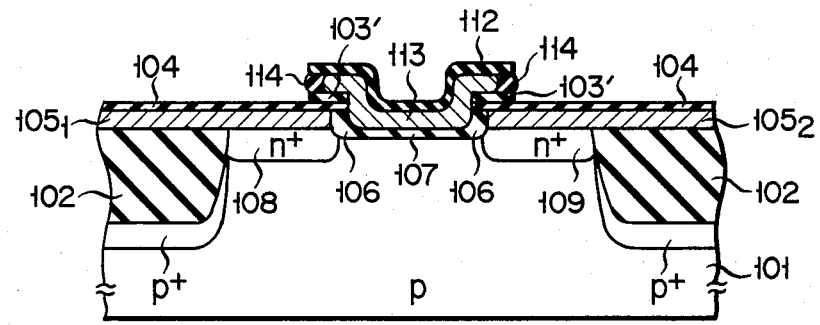
F I G. 6(f)
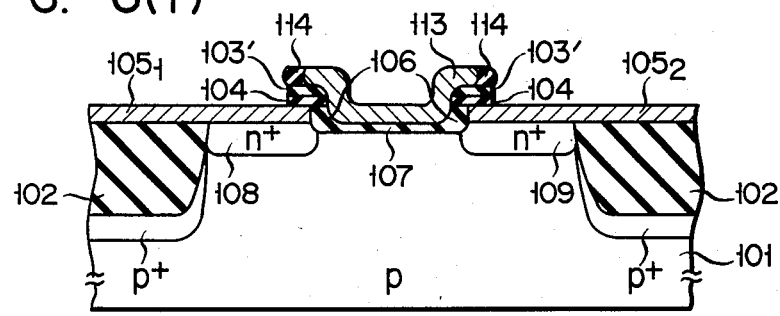
F I G. 6(g)
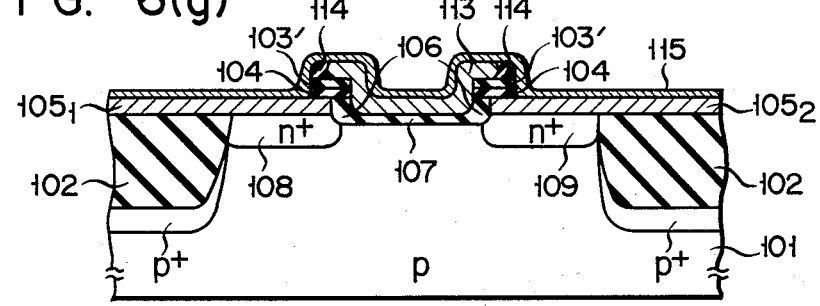
F I G. 6(h)
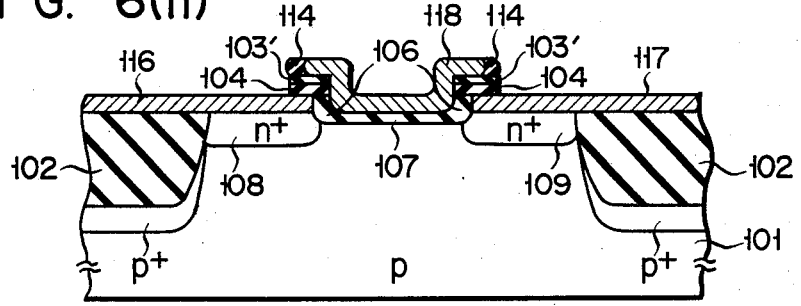

F I G. 7(a)
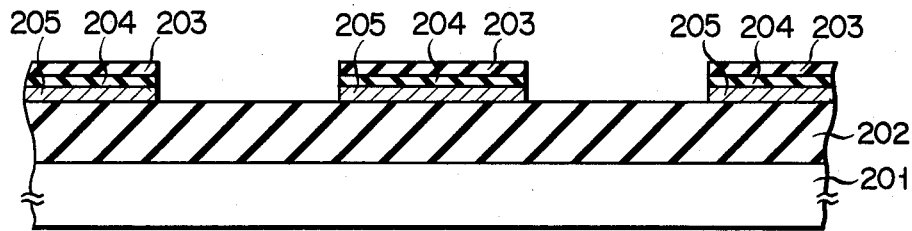
F I G. 7(b)
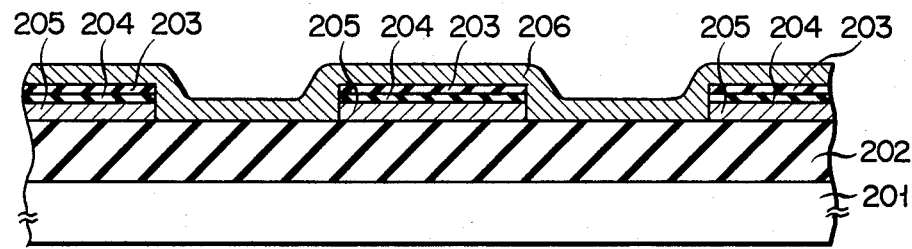
F I G. 7(c)
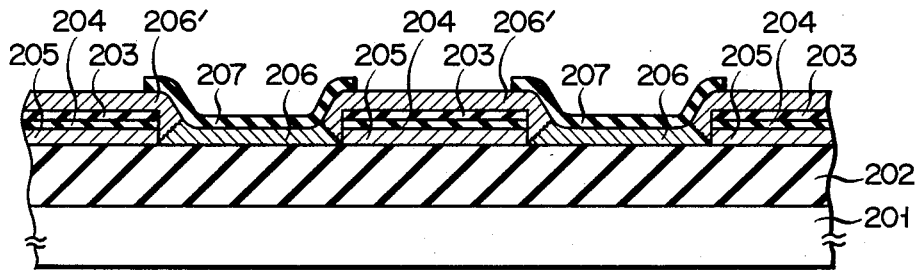
F I G. 7(d)
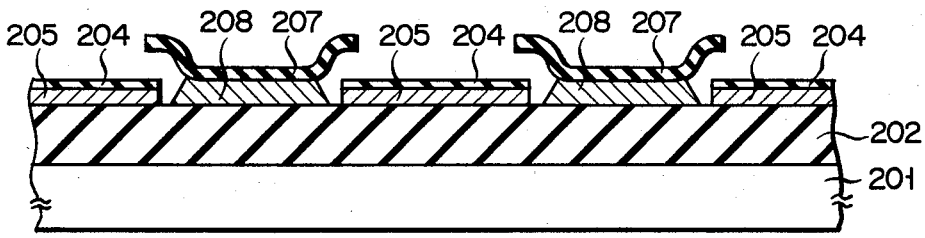

F I G. 7(e)
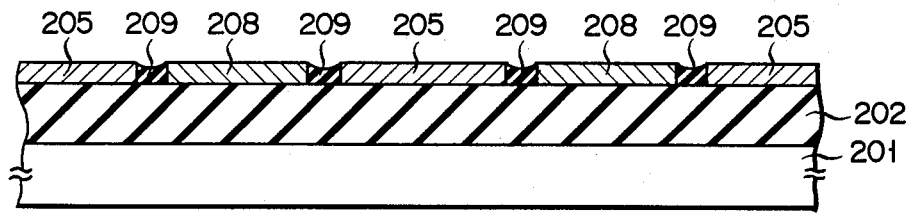
F I G. 7(f)
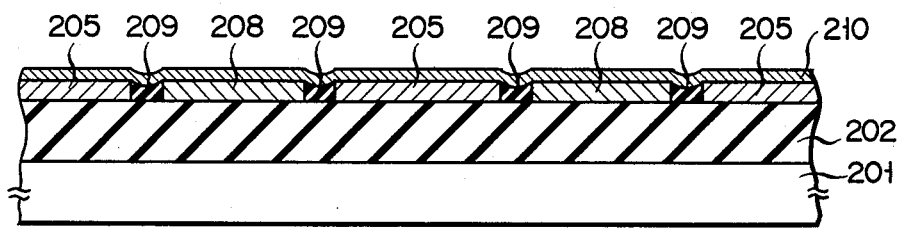
F I G. 7(g)
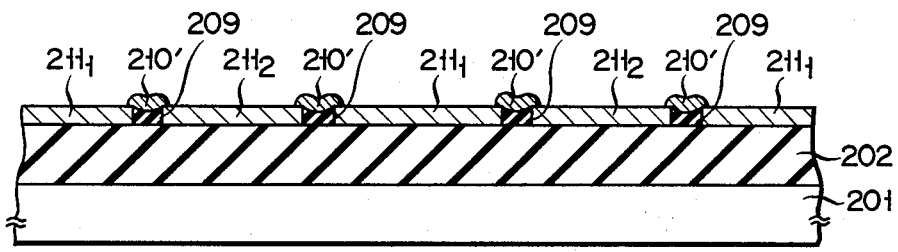
F I G. 7(h)
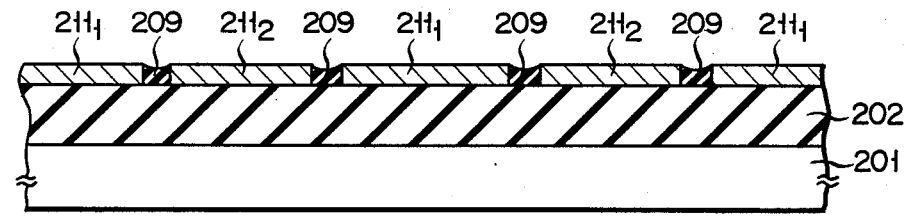

SEMICONDUCTOR DEVICE AND METHOD FOR MANUFACTURING THE SAME

BACKGROUND OF THE INVENTION

The present invention relates to a semiconductor device and a method for manufacturing the same.

The packaging density of the semiconductor devices has been increased greatly as in integrated circuits (IC), large scale integration (LSI) and then very large scale integration (VLSI). Along with the increase in the packaging density, fine patterning technologies have been improved. If large scale integration is developed and the number of transistors formed on a single semiconductor substrate increases, an area for electrode wirings between the transistors is increased. Thus, a higher packaging density may not likely be accomplished.

For example, for forming Al electrode wirings, aluminum is deposited on a field region to a thickness of about 1 to 2 $\mu$m and is patterned by photoetching to form Al wiring patterns which allow connections between semiconductor elements. Further, in metal silicide wirings which have been recently used, polycrystalline silicon is patterned by photoetching and a metal having a high melting point is deposited on the polycrystalline silicon pattern. The wafer is then annealed at a temperature of 500° to 700° C., to form metal silicide wiring patterns. Alternatively, silicon and the metal with a high melting point are simultaneously vacuum deposited. Thereafter, the metal silicide is patterned to form metal silicide wiring patterns. Otherwise, metal silicide is deposited on the polycrystalline silicon pattern and is patterned by photoetching to form metal silicide wiring patterns. In summary, the wiring patterns are formed by photoetching.

However, in the methods described above, precision of the wiring patterns completely depends upon patterning precision of the photoetching technique. With the currently employed photoetching techniques, a distance between the adjacent wirings of the photoresist pattern is 2.0 $\mu$m at best. If electron beam etching is performed, a photoresist patterning provides a minimum isolation distance of 1.0 $\mu$m. However, in consideration of the material uniformity and reproducibility of the silicon wafer as well as side etching of electrode films, the distance between the adjacent wirings may be more or less about 2 to 3 $\mu$m in practice.

SUMMARY OF THE INVENTION

It is, therefore, the primary object of the present invention to provide a method for manufacturing a semiconductor integrated circuit, which provides a small distance between the wirings with an excellent element isolation, which is capable of achieving a multilayer wiring structure, and which can be utilized for VLSI.

It is another object of the present invention to provide a method for manufacturing a semiconductor device, which provides a small distance between the wirings with an excellent element isolation, and which is capable of smoothing a substrate surface after formation of wirings to achieve the multi-layer wiring structure.

It is still another object of the present invention to provide a semiconductor device and a method for manufacturing the same wherein base and collector wirings in an I$^2$L or base and emitter wirings in a bipolar semiconductor device can be made of a metal silicide in a self-aligned manner, resulting in fine patterning of the wiring patterns, a decrease in a wiring resistance, and an increase in the switching speed.

According to one aspect of the present invention, there is provided a method for manufacturing a semiconductor, comprising the steps of:

(a) forming a plurality of first conductive patterns at predetermined intervals which are formed on a semiconductor substrate directly or through an insulating layer and at least on upper surfaces of which first insulating films are formed, respectively;

(b) selectively patterning a conductive film after deposition thereof to form at least one contact hole between two of said first conductive patterns and to form a second conductive pattern in said at least one contact hole; and (c) forming oxide films respectively on side surfaces of said second conductive pattern or forming insulation layers respectively on the side surfaces thereof, and electrically insulating said second conductive pattern from said plurality of first conductive patterns through at least said oxide films or said CVD oxide layers in a self-aligned manner.

According to another aspect of the present invention, there is provided a method for manufacturing a semiconductor device, comprising the steps of:

forming a dielectric layer in a semiconductor substrate having a semiconductor layer of a first conductivity type;

forming at least one first semiconductor region of a second conductivity type in said semiconductor layer in an island form surrounded by said dielectric layer;

forming a second semiconductor region of the first conductivity type in at least one first semiconductor region;

forming a first polycrystalline silicon pattern on said semiconductor layer, said first polycrystalline silicon pattern being in contact with said second semiconductor region and being covered with a first antioxidant insulating film;

performing thermal oxidation to form a first oxide film on side surfaces of said first polycrystalline silicon pattern;

forming a second polycrystalline silicon pattern which crosses over at least said first antioxidant insulating film, which contacts said first semiconductor region, and which has a second antioxidant insulating film thereon;

performing thermal oxidation to form a second oxide film on side surfaces of said second polycrystalline silicon pattern;

etching parts of said first and second antioxidant insulating films which are exposed to the outside; and annealing a metal film having a high melting point after depositing said metal film to cover the entire surface to form high-melting point metal silicide films respectively on parts of said first and second polycrystalline silicon patterns which are exposed by etching of said first and second antioxidant insulating films;

whereby said first and second polycrystalline silicon patterns are formed, which have said high-melting point metal silicide films thereon and which are electrically insulated from each other.

According to still another aspect of the present invention, there is provided a method for manufacturing a semiconductor device, comprising the steps of:

forming a first conductive pattern which has a first insulating film thereon on a semiconductor substrate directly or through an insulating film;

forming a second insulating film on side surfaces of said first conductive pattern;

forming a contact hole in said semiconductor substrate using said first conductive pattern as a mask;

forming a second conductive pattern which has a third insulating film thereon in at least said contact hole;

forming a fourth insulating film on side surfaces of said second conductive pattern; and exposing at least said first and second conductive patterns by partially etching said first insulating film on said first conductive pattern and said third insulating film on said second conductive pattern.

According to still another aspect of the present invention, there is provided a semiconductor device comprising:

a semiconductor substrate having a semiconductor layer of a first conductivity type;

a dielectric film formed to surround said semiconductor substrate;

a first semiconductor region of a second conductivity type formed in said semiconductor layer of the first conductivity type in an island form surrounded by said dielectric film;

a second semiconductor region of the first conductivity type formed at least one portion of said first semiconductor region;

a first amorphous silicon pattern, side surfaces of which are entirely covered with a first insulating film and which is formed on said second semiconductor region; and a second amorphous silicon pattern which crosses over said first amorphous silicon pattern through said first insulating film, which contacts with said first semiconductor region, and side surfaces of which are entirely covered with a second insulating film;

wherein high-melting point metal silicide films are formed on part of a surface of said first amorphous silicon pattern excluding an area on which said second amorphous silicon pattern is formed, and on a surface of said second amorphous silicon pattern.

In order to form the first conductive pattern according to the present invention, a conductive film is formed on a semiconductor substrate directly or through an insulating film. After a first insulating film is selectively formed on the conductive film, the conductive film is selectively etched using the first insulating film as a mask. Alternatively, after the first insulating film is selectively formed, oxidation is performed using the first insulating film as an antioxidant mask and the exposed portion of the conductive film is converted to an oxide film. In the latter method, the first conductive pattern is formed simultaneously when side surfaces of the pattern are covered with a second insulating film (oxide film). On the other hand, in the former method, in order to cover the side surfaces of the first conductive pattern with the second insulating film, the wafer is oxidized to form by epitaxial growth the oxide film (second insulating film) on the side surfaces of the first conductive pattern. The conductive film may comprise a material selected from the group consisting of impurity-doped polycrystalline silicon, impurity-doped amorphous silicon and a metal silicide. Note that undoped polycrystalline silicon or undoped amorphous silicon may be used as a starting material and an impurity may be ion-implanted therein to form impurity-doped polycrystalline or amorphous silicon to form the first conductive pattern. Alternatively, a metal may be deposited on undoped polycrystalline silicon or undoped amorphous silicon to form a metal silicide by thermal oxidation. The first insulating film may comprise a silicon nitride film formed by epitaxial growth, a structure consisting of only an antioxidant insulating film such as an alumina film, or a laminated structure consisting of, for example, a silicon oxide film formed by epitaxial growth and an antioxidant insulating film.

In order to form the second conductive pattern according to the present invention, a conductive film is formed to cover the first conductive pattern, the side surfaces of which are covered with the second insulating film and the upper surface of which is covered with the first insulating film. Thereafter, the conductive film is patterned by photolithography. Alternatively, the third insulating film is selectively formed on the conductive film and the conductive film is etched using the third insulating film as a mask. Another method may be used wherein an impurity-doped film is selectively formed on the first insulating film when the first conductive pattern is formed, the impurity in the impurity-doped film is diffused upward into the conductive film for the second conductive pattern, and an impurity-diffused region is selectively etched by utilizing the differences between the etching rates of the impurity-diffused region and a non-diffused region of the conductive film.

The conductive film may comprise a material selected from the group consisting of impurity-doped polycrystalline silicon, impurity-doped amorphous silicon, a high-melting point metal and a metal silicide. Note that undoped polycrystalline silicon or undoped amorphous silicon may be used as a starting material and an impurity may be ion-implanted therein to form impurity-doped polycrystalline or amorphous silicon to form the second conductive pattern. Alternatively, a metal may be deposited on undoped polycrystalline silicon or undoped amorphous silicon to form a metal silicide by thermal oxidation. The third insulating film may comprise a silicon nitride film formed by epitaxial growth, a structure consisting of only an antioxidant insulating film such as an alumina film, or a laminated structure consisting of, for example, a silicon oxide film formed by epitaxial growth and an antioxidant insulating film.

According to the present invention, after formation of the second conductive pattern, the first and second conductive patterns or one of them may be formed into a metal silicide by the following methods:

(1) A first method comprises the steps of: forming a first conductive pattern of polycrystalline silicon or amorphous silicon and a first insulating film of an antioxidant insulating material; forming a conductive film to cover the entire surface including a surface of the first conductive pattern; selectively forming a third insulating film on the conductive film to allow selective etching with respect to the first insulating film; selectively etching the conductive film using the third insulating film as a mask to form at least one contact hole between two first conductive patterns and to form a second conductive pattern in the contact hole; forming a fourth insulating film on side surfaces of said second conductive pattern to allow selective etching with respect to the first insulating film; exposing most of the first conductive pattern by etching an exposed portion of the first insulating film of the antioxidant insulating material; and forming a metal film to cover the entire surface and converting the first conductive pattern of polycrystalline or amorphous silicon into a metal silicide pattern in a self-aligned manner.

(2) A second method comprises the steps of: forming a conductive film of polycrystalline silicon or amorphous silicon to cover the entire surface including a surface of a first conductive pattern on which a first insulating film is formed having a laminated structure consisting of a silicon oxide film and an antioxidant insulating film; selectively forming a third insulating film of the antioxidant insulating material on the conductive film; selectively etching the conductive film using the third insulating film as a mask to form at least one contact hole between the two first conductive patterns and to form a second conductive pattern in said at least one contact hole; forming a fourth insulating film on side surfaces of said second conductive pattern to allow selective etching with respect to the third insulating film; exposing most of the second conductive pattern by etching exposed portions of the third insulating film and the antioxidant insulating film in the surface layer of the first insulating film; and forming a metal film to cover the entire surface and converting the polycrystalline or amorphous silicon into a metal silicide pattern in a self-aligned manner.

(3) A third method comprises the steps of: forming a first conductive pattern by polycrystalline or amorphous silicon and a first insulating film by an antioxidant insulating material; forming a conductive film of polycrystalline or amorphous silicon to cover the entire surface including a surface of the first conductive pattern; selectively forming a third insulating film of the antioxidant insulating material on the conductive film; selectively etching the conductive film using the third insulating film as a mask to form at least one contact hole between the two first conductive patterns and to form a second conductive pattern in the contact hole; forming a fourth insulating film on side surfaces of the second conductive pattern to perform selective etching with respect to the third insulating film; exposing most of the first and second conductive patterns by etching exposed portions of the first and third insulating films of the antioxidant insulating material; forming a metal film to cover the entire surface and converting polycrystalline or amorphous silicon into a metal silicide pattern in a self-aligned manner.

The metal used in the methods (1) to (3) may comprise a material selected from the group consisting of Pt, W, Ti, Mo, Nb, Ta and Ni.

BRIEF DESCRIPTION OF THE DRAWINGS

FIGS. 4a to 4g are sectional views for explaining the steps of manufacturing a semiconductor device according to a second example of the present invention;

FIGS. 6a to 6h are sectional views for explaining the steps of manufacturing a semiconductor device according to a fourth example of the present invention;

FIGS. 7a to 7h and FIGS. 8a to 8f are sectional views for explaining the steps of manufacturing semiconductor devices according to fifth and sixth examples of the present invention, respectively;

DETAILED DESCRIPTION OF THE PREFERRED EMBODIMENTS

Examples will be described with reference to the accompanying drawings.

EXAMPLE 1

Figure 1A:
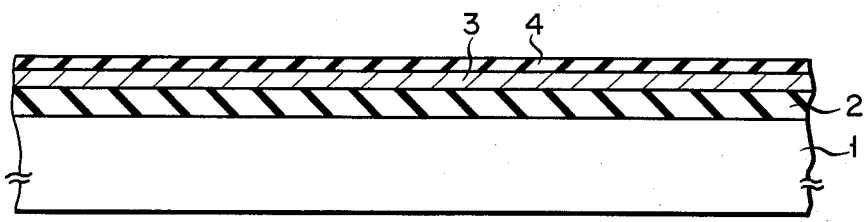
FIGS. 1a to 1g are sectional views for explaining the steps of manufacturing a semiconductor device according to a first example of the present invention.
Figure 1B:
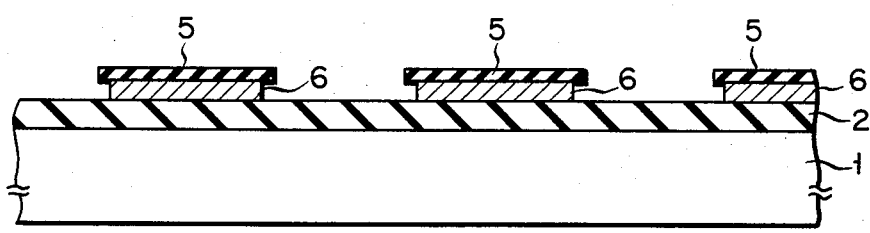

(i) A polycrystalline silicon film 3 of 3,000 Å thickness and a silicon nitride film 4 of 1,000 Å thickness were sequentially formed on a field insulating layer 2 on a semiconductor substrate 1 (FIG. 1a). The silicon nitride film 4 was etched by photoetching to form a plurality of silicon nitride film patterns (first insulating film) 5. The polycrystalline silicon film 3 was then etched using the silicon nitride film patterns 5 as masks, so that first polycrystalline silicon patterns 6 were formed being spaced apart at predetermined intervals (FIG. 1b). Ends of the silicon nitride film patterns 5 overhang the polycrystalline silicon patterns 6, respectively.

Figure 1C:
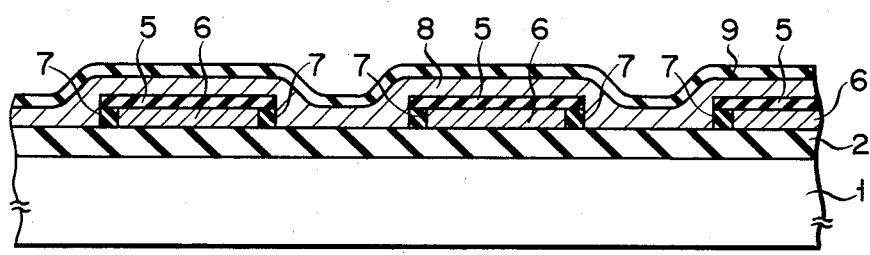

(ii) The wafer was then oxidized. As the polycrystalline silicon patters 6 were covered with the silicon nitride film patterns 5 of an antioxidant insulating material, oxide films (second insulating films) 7 of 2,000 Å thickness were formed only on exposed side edges of the polycrystalline silicon patterns 6, as shown in FIG. 1c. Thereafter, a polycrystalline silicon film 8 of 3,000 Å thickness and a silicon nitride film 9 of 1,000 Å thickness were formed to cover the entire surface (FIG. 1c).

Figure 1D:
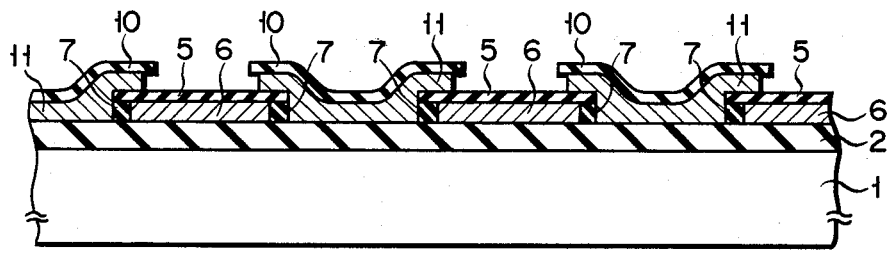
Figure 1E:
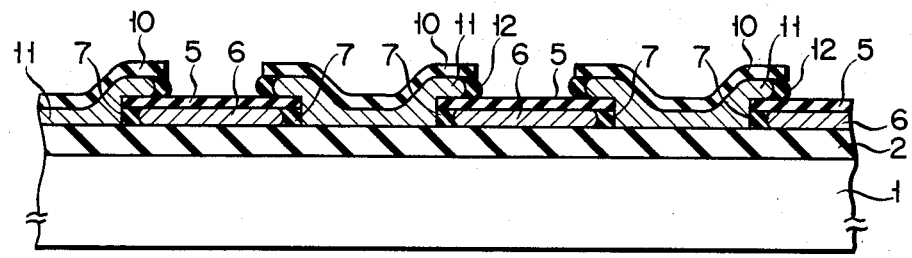

(iii) The silicon nitride film 9 was then patterned by photoetching to form silicon nitride film patterns (third insulating films) 10, major parts of which were formed between the polycrystalline silicon patterns 6 and remaining parts of which overlapped the polycrystalline silicon patterns 6. The polycrystalline silicon film 8 was etched using the silicon nitride film patterns 10 as masks to form second polycrystalline silicon patterns 11, major parts of which were formed between the first polycrystalline silicon patterns 6 and remaining parts of which overlapped thereon through the silicon nitride film patterns 5 and the oxide films 7 (FIG. 1d). Ends of the silicon nitride film patterns 10 overhang the second polycrystalline silicon patterns 11. Subsequently, oxidation was performed. As the second polycrystalline silicon patterns 11 were covered with the silicon nitride patterns 10 of the antioxidant insulating material, oxide films (fourth insulating films) 12 of 3,000 Å thickness were formed only on exposed end faces of the second polycrystalline silicon patterns 11, as shown in FIG. 1e.

Figure 1F:
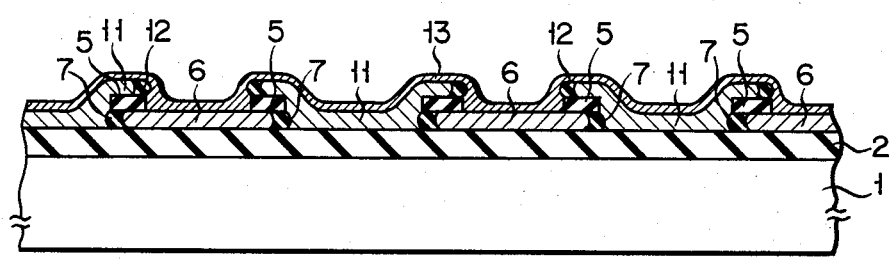

(iv) The wafer was then dry etched by hot phosphoric acid or a Freon type etchant at a temperature of 160° C. The exposed portions of the silicon nitride film patterns 5 and 10 were etched to expose most of the first and second polycrystalline silicon patterns 6 and 11. A platinum film 13 was deposited to cover the entire surface to a thickness of 1,500 Å (FIG. 1f).

(v) The platinum film 13 was then annealed in an atmosphere of nitrogen at a temperature of 550° C. The first and second polycrystalline silicon patterns 6 and 11 which contacted the platinum film 13 were converted into platinum silicide. Part of the platinum film 13 formed on the oxide films 12 at the end faces of the second polycrystalline silicon patterns 11 remained unreacted. The residual portion of the plutinum film 13 was completely etched by nitrohydrochloric acid (HCl:HNO$_3$=3:1) to form platinum silicide wirings 14 and 15 which were isolated from each other through the oxide films 12 in a self-aligned manner (FIG. 1g).

According to the present invention, wirings are self-aligned without isolating wirings by photoetching. The platinum silicide wirings 14 and 15 are isolated in a self-aligned manner by the oxide films 12 which are grown on the side surfaces of the second polycrystalline silicon patterns 11. The distance between the adjacent wirings substantially depends upon the thickness of the oxide film 12. The wiring gap may be as small as 0.1 to 0.3 μm, which cannot be accomplished by the conventional photoetching techniques. Therefore, wirings between the semiconductor elements are highly integrated.

Further, since the wirings 14 and 15 are readily converted into a metal silicide, the sheet resistance of the wirings becomes less than one-tenth of the wiring of polycrystalline silicon doped with a high impurity concentration, and the wiring resistance as a whole is decreased greatly.

Figure 1G:
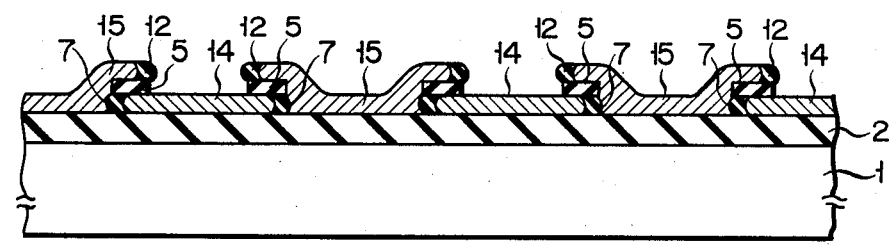

After the platinum silicide wirings 14 and 15 shown in FIG. 1g are formed, an insulating film such as CVD-SiO$_2$ film may be deposited thereon. If the same manufacturing steps as in Example 1 are repeated, a multilayer metal silicide structure may be formed, so that a highly reliable LSI with a high packaging density can be manufactured.

In Example 1, for forming the nitride silicon patterns and the first and second silicon patterns, respectively, shown in FIGS. 1b and 1d, if anisotropic etching such as reactive ion etching is used, highly precise wirings and hence high reliability are accomplished.

Figure 2:
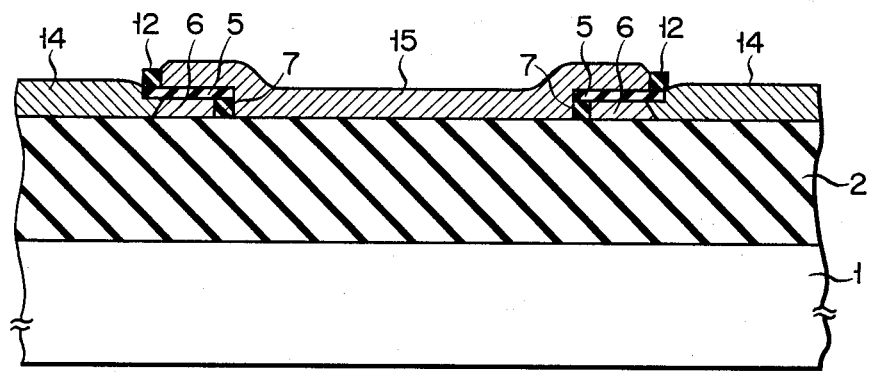
FIGS. 2 and 3 are sectional views of modifications of the semiconductor device shown in Fig. 1g.
Figure 3:
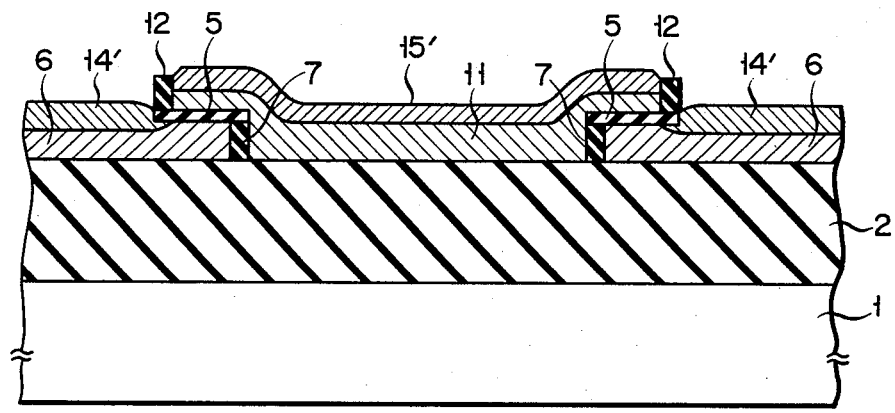

In Example 1, although the first and second polycrystalline silicon patterns 6 and 11 are completely converted to the platinum silicide patterns, portions of the polycrystalline silicon patterns which are under the residual silicon nitride film patterns 5 may remain as polycrystalline silicon, as shown in FIG. 2. Alternatively, as shown in FIG. 3, only the surface layers of the first and second polycrystalline silicon layers 6 and 11 may be converted to platinum silicide to form wirings 14' and 15'.

EXAMPLE 2

(i) A polycrystalline silicon film was deposited on a field insulating layer 2 on a semiconductor substrate 1 as shown in FIG. 4a. The polycrystalline silicon film was then patterned to form first polycrystalline silicon patterns 6. Subsequently, a silicon nitride film 4 of 1,000 Å thickness and a CVD-SiO$_2$ film 16 of 2,000 Å thickness were formed to cover the entire surface (FIG. 4b).

(ii) A polycrystalline silicon film 11 of 2,000 Å thickness and a silicon nitride film 10 of 1,000 Å thickness were deposited and etched by reactive ion etching to form a silicon nitride film pattern (third insulating films) 10, a second polycrystalline silicon pattern 11 and a CVD-SiO$_2$ film pattern 17, respectively (FIG. 4c). Thermal oxidation was then performed. As the first polycrystalline silicon patterns 6 were covered with the silicon nitride film 4 of an antioxidant insulating material, the patterns 6 were not oxidized. Similarly, as the second polycrystalline silicon pattern 11 was covered with the silicon nitride film pattern 10, oxide films (fourth insulating films) 12 were only formed on the side surfaces of the second polycrystalline silicon pattern 11.

(iii) Dry etching was then performed using hot phosphoric acid or a Freon type etchant at a temperature of 160° C. Exposed parts of the silicon nitride film 4 and the silicon nitride film patterns 10 were etched so that the first and second polycrystalline silicon patterns 6 and 11 were mostly exposed (FIG. 4e). Subsequently, as shown in FIG. 4f, a platinum film 13 was deposited to cover the entire surface to a thickness of 1,500 Å and the wafer was annealed in an atmosphere of nitrogen at a temperature of 550° C. The first and second polycrystalline silicon patterns 6 and 11 which contacted the platinum film 13 were converted into platinum silicide. Part of the platinum film 13 which was deposited on the oxide films 12 at the side surfaces of the second polycrystalline silicon pattern 11 remained. The residual part of the platinum film 13 was then etched by nitrohydrochloric acid (HCl:HNO$_3$=3:1) to form platinum silicide wirings 14 and 15 which were isolated from each other in a self-aligned manner through the oxide films 12. Thus, the semiconductor device was prepared (FIG. 4g).

According to Example 2 described above, the CVD-SiO$_2$ film 16 in addition to the silicon nitride film 4 is formed at the overlapping portion between the first platinum silicide wirings 14 and the second platinum silicide wirings 15, so that a wiring capacitance is decreased greaty.

EXAMPLE 3

Figure 5A:
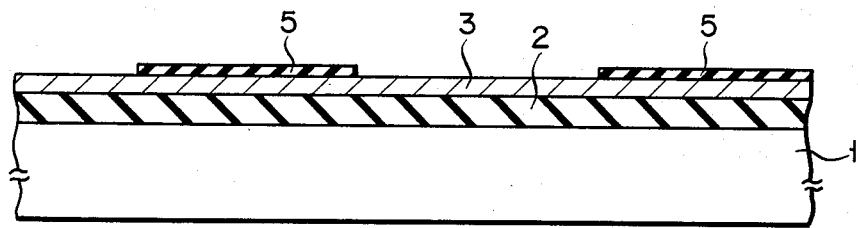
FIGS. 5a to 5g are sectional views for explaining the steps of manufacturing a semiconductor device according to a third example of the present invention.
Figure 5B:
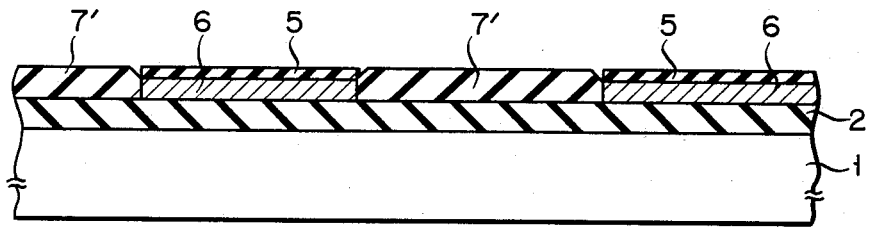

(i) As shown in FIG. 5a, a polycrystalline silicon film 3 of 3,000 Å thickness was deposited on a field insulating film 2 formed on a semiconductor substrate 1. A silicon nitride film of 1000 Å thickness (not shown) was then formed on the polycrystalline silicon film 3. The silicon nitride film was patterned by photoetching to form silicon nitride film patterns (first insulating films) 5. Part of the polycrystalline silicon film 3 which was exposed by thermal oxidation using the silicon nitride film patterns 5 as masks was converted to oxide films (second insulating films) 7' and first polycrystalline silicon patterns 6 were formed (FIG. 5b).

Figure 5C:
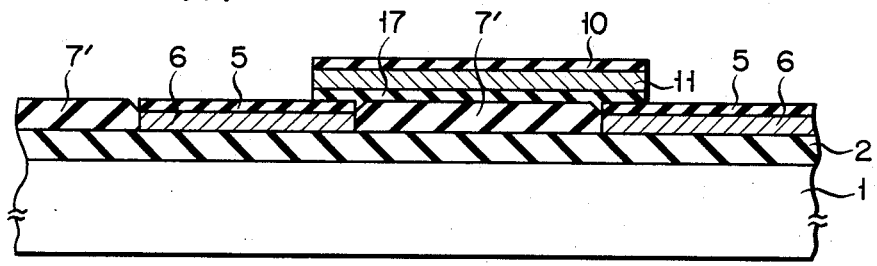
Figure 5D:
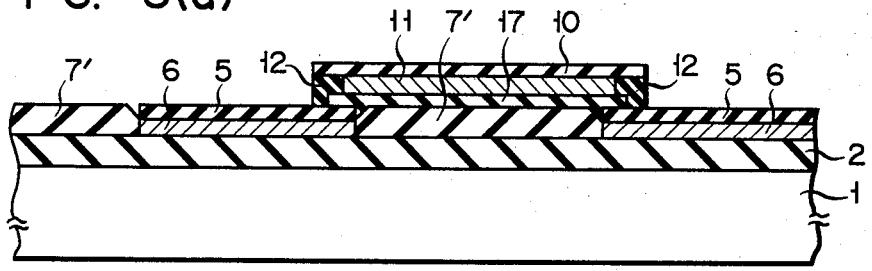

(ii) After a CVD-SiO$_2$ film of 2,000 Å thickness, a polycrystalline silicon film of 2,000 Å thickness, and a silicon nitride film of 1,000 Å thickness were sequentially deposited, the respective films were sequentially patterned by reactive ion etching to form a nitride silicon pattern (third insulating films) 10, a second polycrystalline silicon pattern 11, and a CVD-SiO$_2$ film pattern 17, major parts of which were formed between the polycrystalline silicon patterns 6 and the remaining parts of which overlapped the polycrystalline silicon patterns 6, respectively (FIG. 5c). Oxidation was then performed. As the second polycrystalline silicon pattern 11 was covered with the silicon nitride film pattern 10 of the antioxidant insulating material, an oxide film (fourth insulating films) 12 was formed only on the side surfaces of the second polycrystalline silicon pattern 11, as shown in FIG. 5d.

Figure 5E:
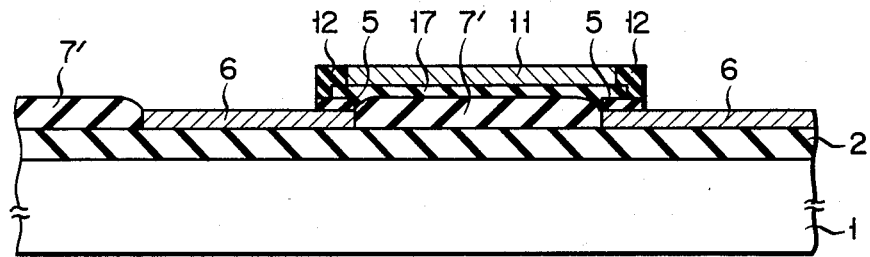
Figure 5F:
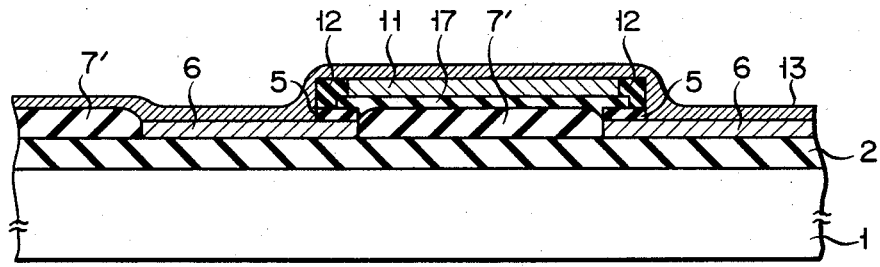
Figure 5G:
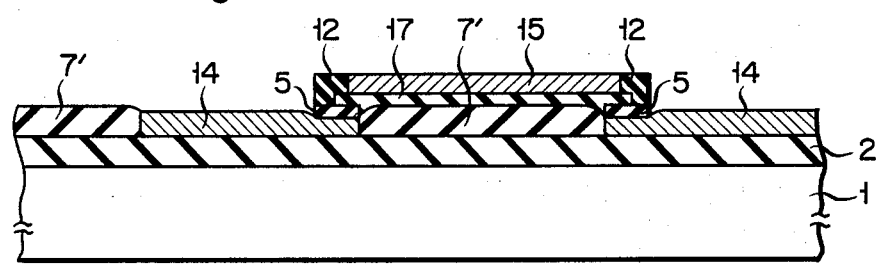

(iii) Dry etching was then performed using hot phosphoric acid or a Freon type etchant at a temperature of 160° C. Exposed parts of the silicon nitride patterns 5 and 10 were etched so that the first and second polycrystalline silicon patterns 6 and 11 were mostly exposed (FIG. 5e). Subsequently, as shown in FIG. 5f, after a platinum film 13 was deposited to cover the entire surface to a thickness of 1,500 Å, the wafer was annealed in an atmosphere of nitrogen at a temperature of 550° C. The first and second polycrystalline silicon patterns 6 and 11 reacted with the platinum film 13 and were converted to platinum silicide. Part of the platinum film 13 which was deposited on the oxide film 12 at the side surfaces of the second polycrystalline silicon pattern 11 remained unconverted. The residual platinum was then etched by nitrohydrochloric acid (HCl:HNO$_3$=3:1) to form platinum silicide wirings 14 and 15 which were isolated from each other in a self-aligned manner through the oxide films 12 (FIG. 5g).

According to Example 2 described above, the first polycrystalline silicon patterns 6 are formed simultaneously when the oxide films 7' are formed at the side surfaces thereof. Thus, the manufacturing steps in Example 2 is simpler than those in Example 1. Further, the first platinum silicide wirings 14 were embedded in the oxide films 7', so that steps therebetween are made small. As a result, patterning of the second platinum silicide wiring 15 is finer. Further, even if another metal wiring crosses the wirings 14 and 15 through an insulating film, disconnections of another metal wiring due to a step are prevented.

EXAMPLE 4

Figure 6A:
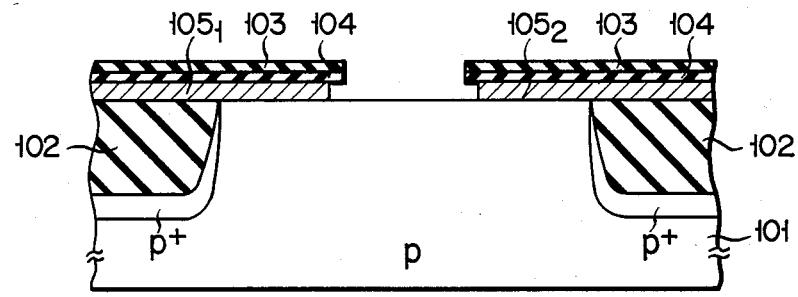

(i) Field insulating layers 102 were formed in a p-type silicon substrate 101 to isolate a prospective element formation region from another. An arsenic-doped n$^+$-type polycrystalline silicon film of 2,000 Å (not shown), a silicon nitride film of 1,000 Å thickness (not shown) and a CVD-SiO$_2$ film of 2,000 Å thickness (not shown) were sequentially deposited on the p-type silicon substrate 101. These films were then patterned to form CVD-SiO$_2$ film patterns 103, silicon nitride film patterns (first insulating films) 104 and first n$^+$-type polycrystalline silicon patterns 105$_1$ and 105$_2$ which extended between the p-type silicon substrate 101 and the field insulating layer 102 (FIG. 6a).

Figure 6B:
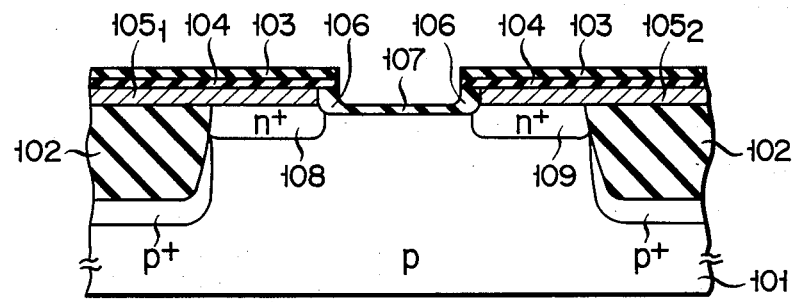

(ii) The wafer was then oxidized. Since the first n$^+$-type polycrystalline silicon patterns 105$_1$ and 105$_2$ were covered with the silicon nitride film patterns 104 of the antioxidant insulating material, oxide films (second insulating films) 106 were grown at side surfaces of the first n$^+$-type polycrystalline silicon patterns 105$_1$ and 105$_2$, as shown in FIG. 6b. Simultaneously, a gate oxide film 107 was grown on an exposed surface of the p-type silicon substrate 101, and arsenic was diffused from the n$^+$-type polycrystalline silicon patterns 105$_1$ and 105$_2$ to the p-type silicon substrate 101 to form n$^+$-type source and drain regions 108 and 109 in a self-aligned manner with respect to the gate oxide film 107.

Figure 6C:
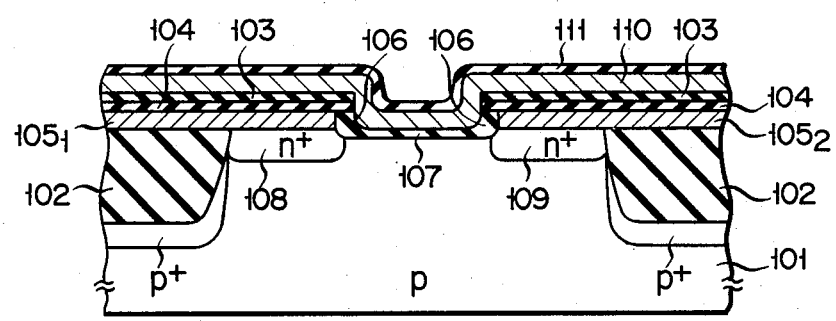
Figure 6D:
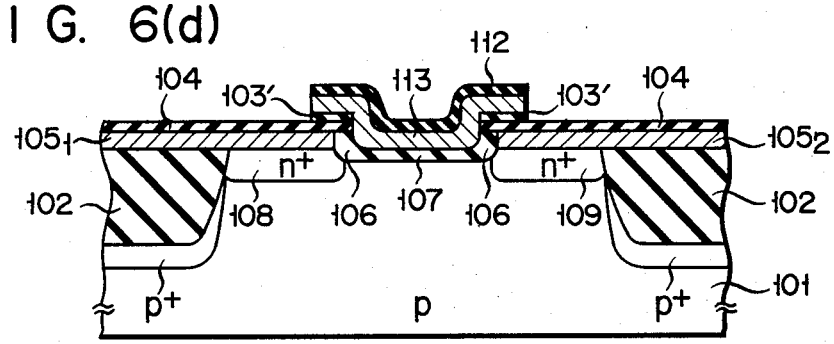

(iii) A polycrystalline silicon film 110 of 2,000 Å thickness and a silicon nitride film 111 of 1,000 Å thickness were sequentially formed to cover the entire surface (FIG. 6c). These films and the CVD-SiO$_2$ film patterns were sequentially selectively etched by reactive ion etching to form a silicon nitride film pattern (third insulating film) 112, a second polycrystalline silicon pattern 113 and a CVD-SiO$_2$ film patterns 103' between the first n$^+$-type polycrystalline silicon patterns 105$_1$ and 105$_2$ (FIG. 6d).

(iv) The wafer was then oxidized. Since the second polycrystalline silicon pattern 113 was covered with the silicon nitride film pattern 112 of the antioxidant insulating material, an oxide film (fourth insulating film) 114 was grown only on the periphery of the second polycrystalline silicon pattern 113, as shown in FIG. 6e. In the above oxidation process, since the first n$^+$-type polycrystalline silicon patterns 105$_1$ and 105$_2$ were covered with the silicon nitride patterns 104, these patterns 105$_1$ and 105$_2$ may not be oxidized. The wafer was then dry etched by hot phosphoric acid or a Freon type etchant at a temperature of 160° C. Exposed parts of the silicon nitride film patterns 104 and 112 were etched so that the first n$^+$-type polycrystalline silicon patterns 105$_1$ and 105$_2$ and the second polycrystalline silicon pattern 113 were mostly exposed (FIG. 6f).

(v) After a platinum film 115 was deposited to cover the entire surface to a thickness of 1,500 Å, as shown in FIG. 6g, the platinum film 115 was annealed in an atmosphere of nitrogen at a temperature of 550° C. The first n$^+$-type polycrystalline silicon patterns 105$_1$ and 105$_2$ and the second polycrystalline silicon pattern 113 which contacted the platinum film 115 were converted to platinum silicide to form the n$^+$-type source and drain regions 108 and 109, source and drain electrode wirings 116 and 117 of platinum silicide which directly contacted the n$^+$-type source and drain regions 108 and 109, and a gate electrode 118 of platinum silicide which was isolated from the wirings 116 and 117 through the oxide films 106 in a self-aligned manner. Thus, a MOS transistor is manufactured (FIG. 6h). Platinum deposited on the oxide film 114 in the side surface of the gate electrode 118 of platinum silicide remained unconverted. The residual platinum was then etched by nitrohydrochloric acid (HCl:HNO$_3$=3:1).

According to Example 4 described above, the source and drain electrode wirings 116 and 117, and the gate electrode 118 of platinum silicide are isolated in a self-aligned manner by the oxide film 114 grown in the side surfaces of the second polycrystalline silicon pattern 113. The isolation length can be controlled by the thickness of the oxide film 114. The distance between the source electrode wiring 116 and the gate electrode 118 or between the drain electrode wiring 117 and the gate electrode 118 can be as short as 0.1 to 0.3 μm, which cannot be accomplished by the conventional photoetching techniques. As a result, a highly integrated MOS transistor can be obtained. Further, since the first n$^+$-type polycrystalline silicon patterns 105$_1$ and 105$_2$ are used as diffusion sources for the source and drain regions and since the oxide films 106 are grown to electrically insulate the gate electrode from the n$^+$-type polycrystalline silicon patterns 105$_1$ and 105$_2$, the n$^+$-type source and drain regions 108 and 109 are formed in a self-aligned manner with respect to the gate electrode 118. Further, in Example 4, since the source and drain electrode wirings 116 and 117, and the gate electrode 118 can be readily converted to platinum silicide, the sheet resistance is below about one-tenth of polycrystalline silicon doped with a high impurity concentration. Therefore, a high-speed MOS transistor can be obtained.

EXAMPLE 5

(i) A polycrystalline silicon film of 3,000 Å thickness (not shown), a silicon nitride film of 1,000 Å thickness (not shown), and an arsenic-doped glass film (to be referred to as an AsSG film hereinafter) of 2,000 Å thickness (not shown) were sequentially deposited on a field insulating layer 202 formed on a semiconductor substrate 201. The AsSG film was then patterned by reactive ion etching to form AsSG film patterns (impurity-doped films) 203. Thereafter, the silicon nitride film and the polycrystalline silicon film were sequentially patterned to form silicon nitride patterns (first insulating films) 204, and first polycrystalline silicon patterns 205 (FIG. 7a).

(ii) As shown in FIG. 7b, a polycrystalline silicon film 206 was deposited to cover the entire surface to a thickness of 3,000 Å. A silicon nitride film was then deposited to the polycrystalline silicon film 206 to a thickness of 1,000 Å. The silicon nitride film was patterned by photoetching to form silicon nitride patterns (third insulating film) 207 which were formed between the first polycrystalline silicon patterns 205 and parts of which overhang the patterns 205 (FIG. 7c). Thermal oxidation was then performed in an atmosphere of nitrogen. Highly concentrated arsenic in the AsSG film patterns 203 was selectively diffused upward into the polycrystalline silicon film 206 to form n+-type polycrystalline silicon regions 206' in the polycrystalline silicon film 206 (FIG. 7c) in a self-aligned manner. The n+-type polycrystalline silicon region 206' was selectively etched by a Freon type etchant or an HF type etchant in a self-aligned manner using a difference between the etching rates of n+-type polycrystalline silicon and undoped polycrystalline silicon. Thus, second polycrystalline silicon patterns 208 were formed between the first polycrystalline silicon patterns 205 (FIG. 7d). In other words, the second polycrystalline silicon patterns 208 were formed between the first polycrystalline silicon patterns 205 in a self-aligned manner. Thereafter, the AsSG film patterns 203 were etched (FIG. 7d).

(iii) Thermal oxidation was then performed. Since the first and second polycrystalline silicon patterns 205 and 208 were covered with the silicon nitride film patterns 204 and 207 of the antioxidant insulating material, respectively, oxide films (second insulating films) 209 were formed only on side surfaces of the first and second polycrystalline silicon patterns 205 and 208, as shown in FIG. 7e. The first and second polycrystalline silicon patterns 205 and 208 were isolated from each other in a self-aligned manner through the oxide films 209. Thereafter, dry etching was performed using hot phosphoric acid or a Freon type etchant at a temperature of 160° C. Only the silicon nitride patterns 204 and 207 were etched (FIG. 7e).

(iv) A platinum film 210 was deposited to cover the entire surface to a thickness of 1,500 Å, as shown in FIG. 7f. The platinum film 210 was annealed in an atmosphere of nitrogen at a temperature of 550° C. The first and second polycrystalline silicon patterns 205 and 208 reacted with the platinum film 210 and were converted to platinum silicide to form first and second platinum silicide wirings $211_1$ and $211_2$. Platinum deposited on the oxide films 209 between the first and second polycrystalline silicon patterns 205 and 208 remained unconverted (FIG. 7g). Residual platinum portions 210' were etched by nitrohydrochloric acid ($HCl:HNO_3=3:1$). Therefore, a semiconductor device having the first and second platinum silicide wirings $211_1$ and $211_2$ was prepared (FIG. 7h).

According to the present invention, wiring isolation can be performed in a self-aligned manner without the conventional photoetching techniques. The second polycrystalline silicon patterns 208 are formed between the first polycrystalline silicon patterns 205 in a self-aligned manner. Further, highly precise oxide films 209 are formed on side surfaces of the first and second polycrystalline silicon patterns 205 and 208, so that the first and second platinum silicide wirings $211_1$ and $211_2$ are isolated from each other in a self-aligned manner. The isolation gap is controlled by the thickness of the oxide films 209 and is as short as 0.1 to 1.0 μm, which cannot be accomplished in the conventional photoetching techniques. The wirings between the semiconductor elements are highly integrated.

Further, as described above, the wirings $211_1$ and $211_2$ are readily converted to metal silicide. Therefore, the sheet resistance is below one-tenth of impurity-doped polycrystalline silicon of a high impurity concentration and the wiring resistance as a whole is decreased greatly.

Further, since the highly precise insulating oxide films 209 are filled between the platinum silicide wirings $211_1$ and $211_2$, the substrate surface after formation of wirings is smooth. Even if another wiring as the second conductive layer crosses the wirings $211_1$ and $211_2$ as the first conductive layer, the wiring as the second conductive layer may not be disconnected due to a step formed by the first conductive layer. As a result, the film thickness in the wirings as the first conductive layer can be great, resulting in decrease in the wiring resistance, and hence the manufacture of an LSI used with a large current. Further, even if the film thickness of the wirings is increased, wirings can be formed in a space in the line-and-space, resulting in fine patterning of the wirings. Therefore, metal silicide wirings can be formed with a multi-layer structure. Further, if the polycrystalline silicon wirings are combined with metal wirings, highly reliable and precise ISIs having various types of multi-layer structures may be obtained.

A case will be described with reference to FIGS. 8a to 8f and FIG. 9 in which the present invention is applied to the manufacture of a bipolar LSI.

EXAMPLE 6

Figure 8A:
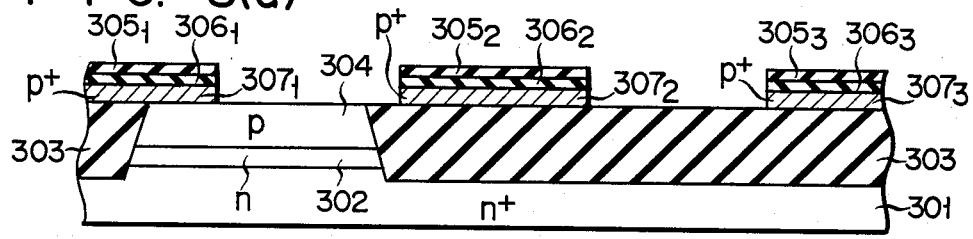

(i) An n-type epitaxial layer 302 (collector region) was formed on an n+-type silicon substrate 301 and a field insulating layer 303 was formed by selectively oxidizing the n-type epitaxial layer 302. Further, a p-type base region 304 was formed in the n-type epitaxial layer 302. A boron-doped polycrystalline silicon film of 3,000 Å thickness, a silicon nitride film of 1,000 Å thickness and an AsSG film of 2,000 Å thickness were sequentially formed to cover the entire surface. These films were then sequentially patterned in the same manner as in Example 5 to form first p+-type polycrystalline silicon patterns $307_1$ to $307_3$ which were covered by first silicon nitride film patterns $306_1$ to $306_3$ and first AsSG film patterns $305_1$ to $305_3$ in a region extending between the filed insulating layer 303 and the p-type base region 304 and a region of the field insulating layer 303 at predetermined intervals (FIG. 8a).

Figure 8B:
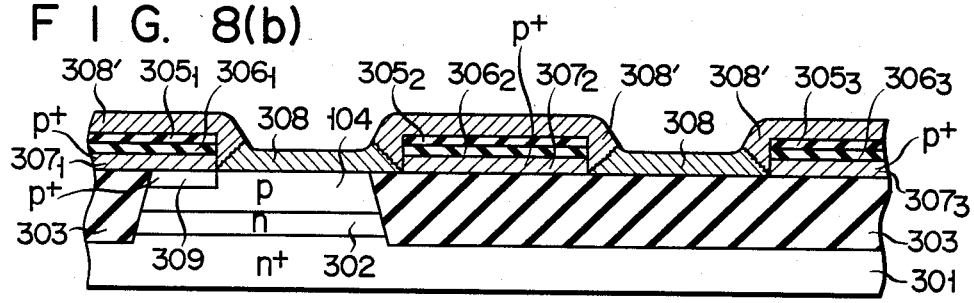

(ii) A polycrystalline silicon film 308 was then deposited by the CVD method to cover the entire surface to a thickness of 3000 Å, and the wafer was annealed. Highly concentrated arsenic from the first AsSG film patterns $305_1$ to $305_3$ was selectively diffused upward into the polycrystalline silicon film 308 to form n+-type polycrystalline silicon regions 308' in the polycrystalline silicon film 308 in a self-aligned manner. Simultaneously, boron in the first p+-type polycrystalline silicon pattern $307_1$ which contacted to the p-type base region 304 was diffused to form a p+-type base electrode region 309 in the p-type base region 304 (FIG. 8b).

Figure 8C:
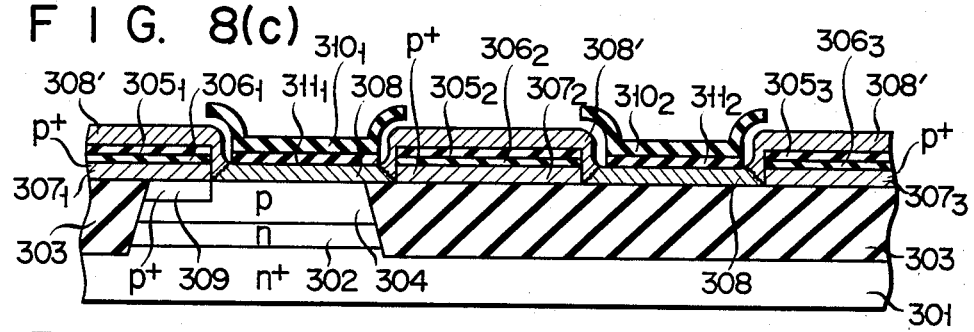

(iii) An AsSG film of 2,000 Å thickness and a silicon nitride film of 1,000 Å thickness were subsequently deposited to cover the entire surface. These films were then patterned by photoetching to form two-layer patterns respectively consisting of a second silicon nitride film pattern $310_1$ and a second AsSG film pattern $311_1$ and of a second silicon nitride film pattern $310_2$ and a second AsSG film pattern $311_2$ on parts of undoped polycrystalline film 308 between the first p+-type polycrystalline silicon patterns $317_1$ to $307_3$ (FIG. 8c).

Figure 8D:
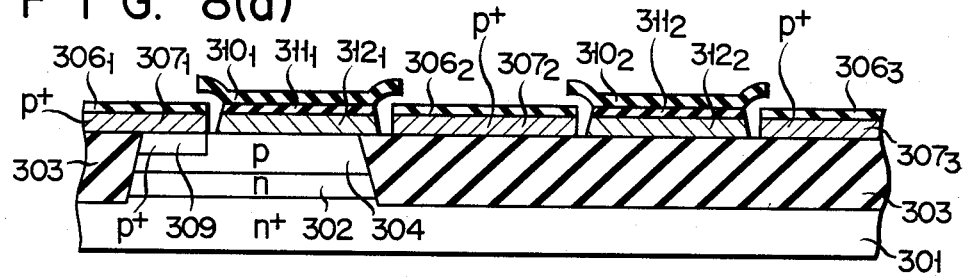

(iv) In the same manner as in Example 5, the n+-type polycrystalline silicon regions 308' were etched using a Freon type etchant or an HF type etchant to form second polycrystalline silicon patterns $312_1$ and $312_2$ between the first p+-type polycrystalline silicon patterns $307_1$ to $307_3$. The first AsSG film patterns $305_1$ to $305_3$ were etched (FIG. 8d).

Figure 8E:
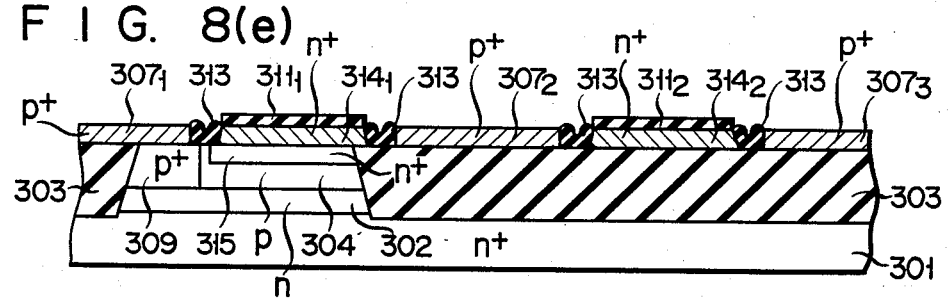

(v) Thermal oxidation was then performed in an atmosphere of oxygen at a high temperature. As the first p+-type polycrystalline silicon patterns $307_1$ to $307_3$ were covered with the first silicon nitride film patterns $306_1$ to $306_3$ of the antioxidant insulating material and the second polycrystalline silicon patterns $312_1$ and $312_2$ were covered with the second silicon nitride film patterns $310_1$ and $310_2$, oxide films 313 were formed to fill areas between the first p+-type polycrystalline silicon patterns $307_1$ to $307_3$ and the second polycrystalline silicon patterns $312_1$ and $312_2$, shown in FIG. 8e. The first p+-type polycrystalline silicon patterns $307_1$ to $307_3$ were isolated from the second polycrystalline silicon patterns $312_1$ and $312_2$ through the oxide films 313. Simultaneously, arsenic in the second AsSG film patterns $311_1$ and $311_2$ was diffused upward into the second polycrystalline silicon patterns $311_1$ and $311_2$ which were converted to n+-type polycrystalline silicon patterns $314_1$ and $314_2$. Further, arsenic in the n+-type polycrystalline silicon pattern $314_1$ which contacted the p-type base region 304 was diffused into the p-type base region 304 to form an n+-type emitter region 315 therein. Thereafter, dry etching was performed using hot phosphoric acid or a Freon type etchant at a temperature of 160° C. to etch the first and second nitride film patterns $306_1$ to $306_3$, $310_1$ and $310_2$ (FIG. 8e).

Figure 8F:
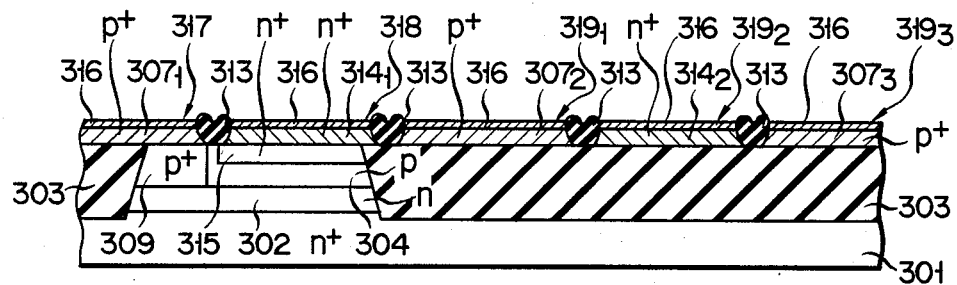
Figure 9:
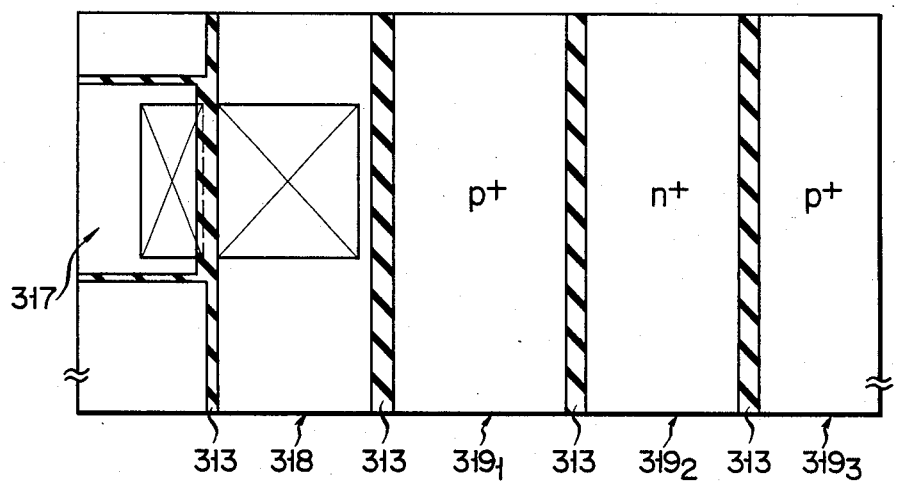
FIG. 9 is a plan view of the semiconductor device shown in FIG. 8f.

(vi) After the second AsSG film patterns $311_1$ and $311_2$ were etched, a platinum film was deposited to cover the entire surface in the same manner as in Example 1. The platinum film was then annealed to convert surface layers of the polycrystalline silicon patterns to platinum silicide. The residual platinum on the oxide films 313 was etched by nitrohydrochloric acid. Thus, the p+-type base electrode region 309 directly contacted a base wiring 317 having a platinum silicide layer 316 in its surface layer. The n+-type emitter region 315 directly contacted a emitter wiring 318 having a platinum silicide layer 316 in its surface layer. Further, jumper wirings $319_1$ to $319_3$ which had the platinum silicide layer 316 in their surface layers were formed on the field insulating layer 303. Thus, a bipolar LSI was prepared (FIGS. 8f and 9). FIG. 9 is a plan view of the transistor of the LSI shown in FIG. 8f.

According to Example 6 described above, the base, emitter, jumper wirings 317, 318 and $319_1$ to $319_3$ which have platinum silicide layer 316 in their surface layers are isolated in a self-aligned manner by the oxide films 313 formed between the first and second polycrystalline silicon patterns $307_1$ to $317_3$ and $312_1$ and $312_2$ ($314_1$ and $314_2$) Further, since the first p+-type polycrystalline silicon pattern $307_1$ and second n+-type polycrystalline silicon pattern $314_1$ were used as diffusion sources and since the oxide film 313 is formed therebetween, the p+-type outer base region 309 and the n+-type emitter region 315 can be formed in the p-type base region 304. Simultaneously, without forming the contact holes for the base and emitter, the base and emitter wirings are formed being isolated by the oxide film 313, resulting in fine patterning of the bipolar transistor. Further, the platinum silicide layer 316 is formed on the surface layers of the base, emitter and jumper wirings 317, 318 and $319_1$ to $319_3$, resulting in a low wiring resistance as a whole.

Figure 10:
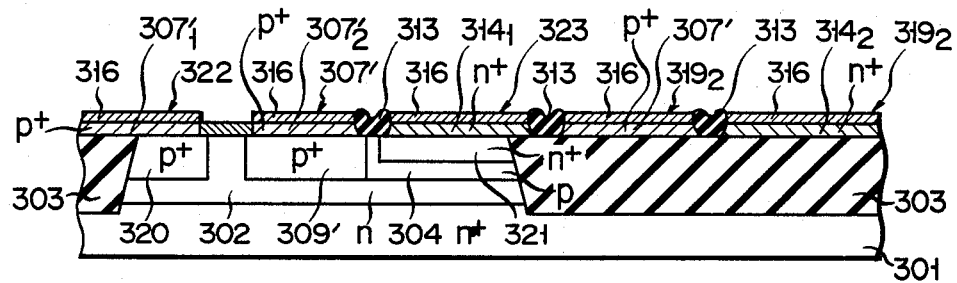
FIG. 10 is a sectional view of an I²L semiconductor device to which the fifth example of the present invention is applied.

According to the present invention, an I²L in addition to the bipolar LSI in Example 6 can be manufactured by basically following the same manufacturing steps, as shown in FIG. 10. Referring to FIG. 4, reference numeral 320 denotes a p+-type injector formed when a p+-type polycrystalline silicon pattern $307_1'$ as a diffusion source. Reference numeral 309' denotes a p+-type base electrode region formed when a first p+-type polycrystalline silicon pattern $307_2'$ as a diffusion source. Reference numeral 321 denotes an n+-type collector region formed when the second n+-type polycrystalline silicon pattern $314_1$ as a diffusion source. Reference numeral 322' denotes an injector wiring having the platinum silicide film 316 in its surface layer. Reference numeral 317' denotes a base wiring having the platinum silicide layer 316. Finally, reference numeral 323 denotes a collector wiring having the platinum silicide layer 316.

A case will be described with reference to FIGS. 11a to 11g, 12 and 13 in which the present invention is applied to the manufacture of an I²L.

EXAMPLE 7

Figure 11A:
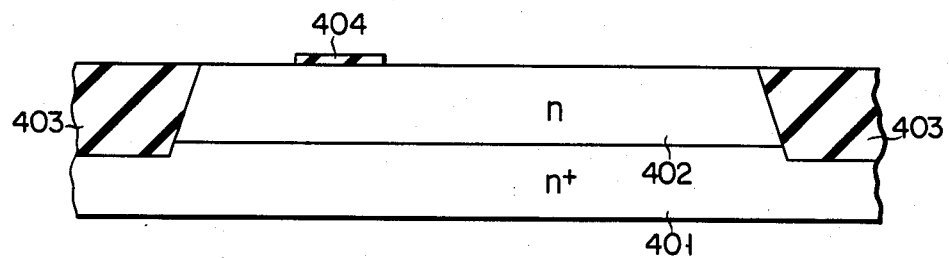
FIGS. 11a to 11g are sectional views for explaining the steps of manufacturing a semiconductor device according to a seventh example of the present invention.

(i) An n-type silicon epitaxial layer 402 was formed on an n+-type silicon layer 401. Phosphorus of a high concentration was selectively diffused into the n-type epitaxial layer 402 to form an n+-type layer which was defined as an emitter region (not shown). A buffer oxide film (not shown) of 100 Å thickness and a silicon nitride film (not shown) of 1,000 Å thickness were sequentially formed to cover the entire surface. Thereafter, the silicon nitride film was etched to form a contact hole. The n-type silicon epitaxial layer 402 was selectively etched to a thickness of about 0.5 to 0.7 μm, using the silicon nitride film as a mask. Thermal oxidation was then performed using the silicon nitride film as an antioxidant mask to form silicon oxide films 403 to a thickness of 1.0 to 1.5 μm. The silicon oxide film 403 is called an oxide film color or field isolation layer since it surrounds a prospective I²L gate formation region. The silicon oxide films 403 were used to isolate an I²L from another and to increase efficiency of minority carriers injected from the emitter region to the base region. Thereafter, the silicon nitride film was completely etched and a thermal oxide film of 2,000 Å thickness was formed to cover the entire surface. The thermal oxide film was then patterned to form a thermal oxide pattern 404 on the n-type silicon epitaxial layer 402 and between a prospective outer base region and a prospective injector region (FIG. 11a).

Figure 11B:
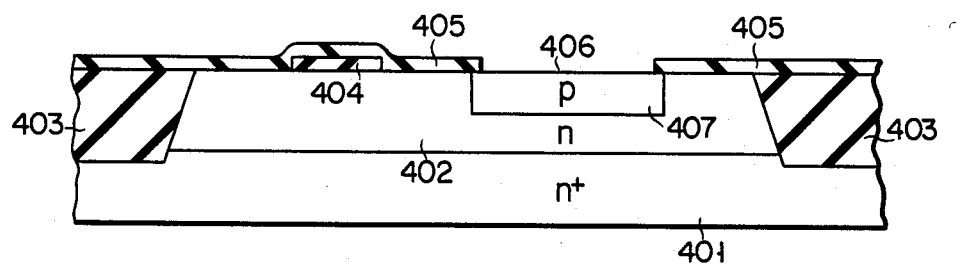

(ii) A thin buffer oxide film (not shown) of 50 to 100 Å thickness and a silicon nitride film 405 of 500 to 1,000 Å thickness were sequentially formed to cover the entire surface. The buffer oxide film and the silicon nitride film 405 were selectively etched to form a contact hole 406 on a prospective inner base region. Boron which was a p-type impurity was ion-implanted through the contact hole 406 and was activated to form a p-type inner base region 407 in a surface layer of the n-type silicon epitaxial layer 402 (FIG. 11b).

Figure 11C:
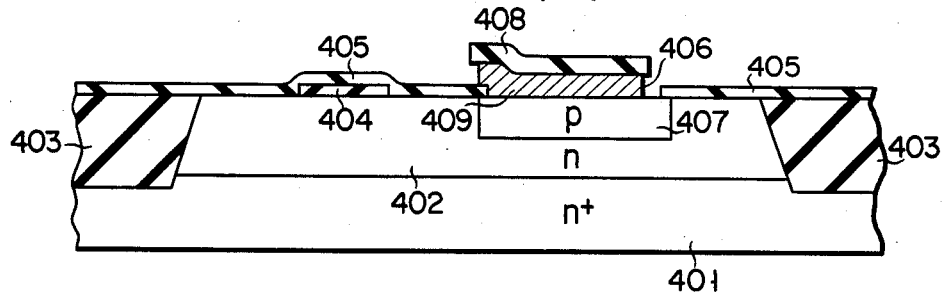

(iii) An arsenic-doped n+-type polycrystalline silicon film of 2,000 to 3,000 Å thickness and a silicon nitride film of 2,000 Å thickness were sequentially formed to cover the entire surface. These films were then patterned by photoetching to form a first silicon nitride pattern 408, the ends of which horizontally extended toward the thick silicon oxide film 403. Subsequently, the n+-type polycrystalline silicon film was patterned to form an n+-type polycrystalline silicon pattern 409, part of which contacted the inner base region 407 through the contact hole 406 and both ends of which faced the thick silicon nitride film 403 (FIG. 11c). The width of the contact hole 406 of the silicon nitride film 405 must be the same as that of the n+-type polycrystalline silicon pattern 409 in mask alignment. If there is no alignment error in photoetching, the n+-type polycrystalline silicon pattern 409 is formed in the contact hole 406 of the silicon nitride film 405. However, in practice, an alignment error of about 1 to 2 $\mu$m occurs in general production lines. As shown in FIG. 11c, the n+-type polycrystalline silicon pattern 409 was misaligned with respect to its contact hole 406. However, such an error does not influence the electrical characteristics of the $I^2L$ to be manufactured according to a method of the present invention.

Figure 11D:
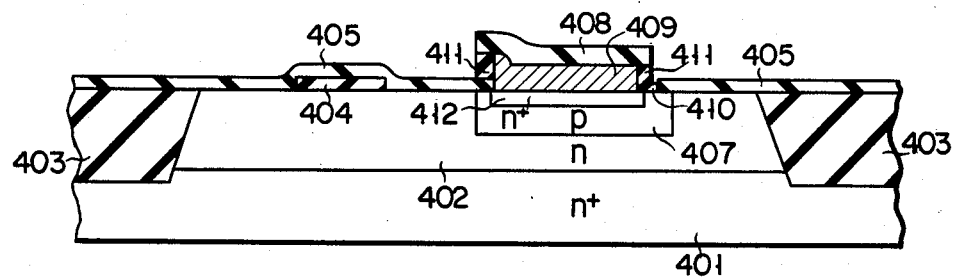

(iv) Thermal oxidation was then performed at a temperature of 900° to 950° C. Since part of the upper surface of the inner base region 407 and side surfaces of the n+-type polycrystalline silicon pattern 409 were not coverted with the silicon nitride film pattern 408, an oxide film 410 of 1,000 Å thickness was formed on the exposed upper surface (inner base region 407) of the n-type silicon epitaxial layer 402, and simultaneously a first oxide film 411 of 1,000 to 3,500 Å thickness which insulated the n+-type polycrystalline silicon pattern 409 from the outside was formed on the exposed side surfaces of the n+-type polycrystalline silicon pattern 409. Simultaneously, arsenic in the n+-type polycrystalline silicon pattern 409 was diffused into the p-type inner base region 407 through the contact hole 406 to form an n+-type collector region 412 (FIG. 11d). Upon formation of the collector region 412, the n+-type polycrystalline silicon pattern 409 functioned as a collector wiring.

Figure 11E:
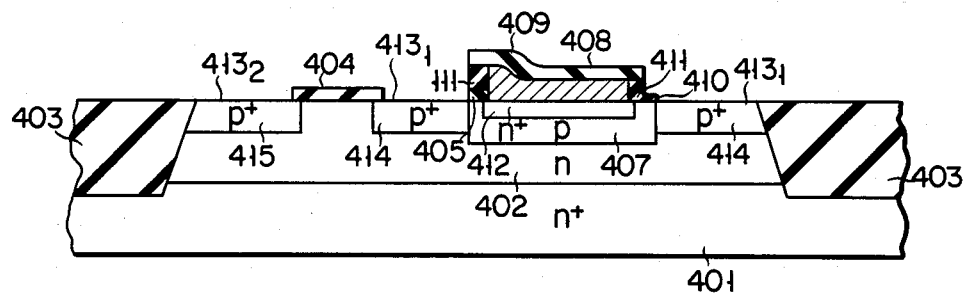

(v) Only parts of the silicon nitride film 405 which corresponded to the prospective outer base region and the prospective injector region were etched by dry etching using hot phosphoric acid or a Freon type etchant at a temperature of 160° C. A contact hole 413₁ was then formed in a self-aligned manner with respect to the thermal oxide film pattern 404 and the first oxide film 411 on the side surfaces of the n+-type polycrystalline silicon pattern 409. The contact hole 413₁ acted as a base contact as well as a diffusion window. Simultaneously, a contact hole 413₂ was formed in a self-aligned manner with respect to the thick silicon oxide film 403 and to the thermal oxide film pattern 404. The contact hole 413₂ acted as an injector contact and a diffusion window. The thickness of the first silicon nitride film pattern 408 on the n+-type polycrystalline silicon pattern 409 was decreased by the thickness of the etched silicon nitride film 405. A p-type impurity such as boron was ion-implanted through the contact holes 413₁ and 413₂ and was activated to form a p+-type outer base region 414 and a p+-type injector region 415 in the surface layer of the n-type silicon epitaxial layer 402 (FIG. 11e).

Figure 11F:
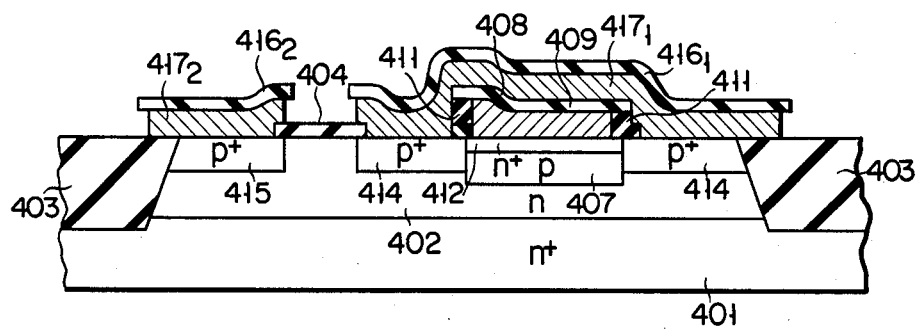

(vi) The buffer oxide film on the contact holes 413₁ and 413₂ was etched. At this time, since the oxide film 411 formed on the side surfaces of the n+-type polycrystalline silicon pattern 409 is dense and has a thickness of about 3,500 Å, it was slightly etched (100 Å) by an HF etchant, which may be substantially negligible. An undoped polycrystalline silicon film was deposited to cover the entire surface to a thickness of 2,000 to 3,000 Å. Boron was then ion-implanted in the undoped polycrystalline silicon film which was in turn converted to a p+-type polycrystalline silicon film. A silicon nitride film was then deposited on the p+-type polycrystalline silicon film to a thickness of 1,000 Å. The silicon nitride film was patterned by photoetching to form second silicon nitride film patterns 416₁ and 416₂. Subsequently, the p+-type polycrystalline silicon film under the second silicon nitride film patterns 416₁ and 416₂ was patterned by photoetching. Therefore, a p+-type polycrystalline silicon pattern 417₁ was formed which contacted the p+-type outer base region 414 through the contact hole 413₁ and which crossed over the first silicon nitride film pattern 408. Simultaneously, a p+-type polycrystalline silicon pattern 417₂ was formed which contacted the p+-type injector region 415 through the contact hole 413₂ (FIG. 11f).

Figure 11G:
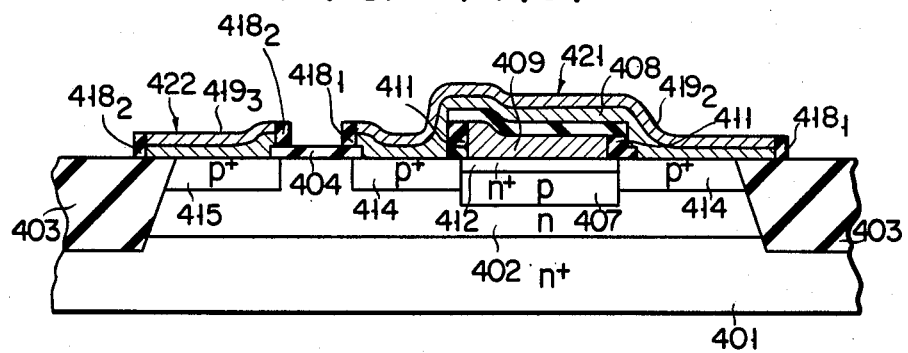
Figure 12:
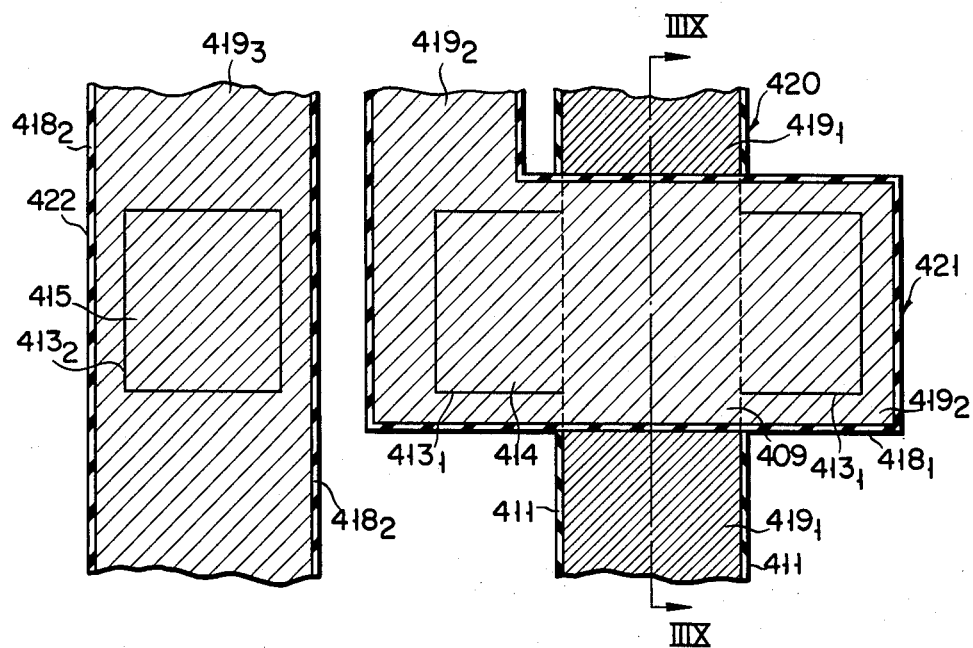
FIG. 12 is a plan view of the semiconductor device shown in FIG. 11g.
Figure 13:
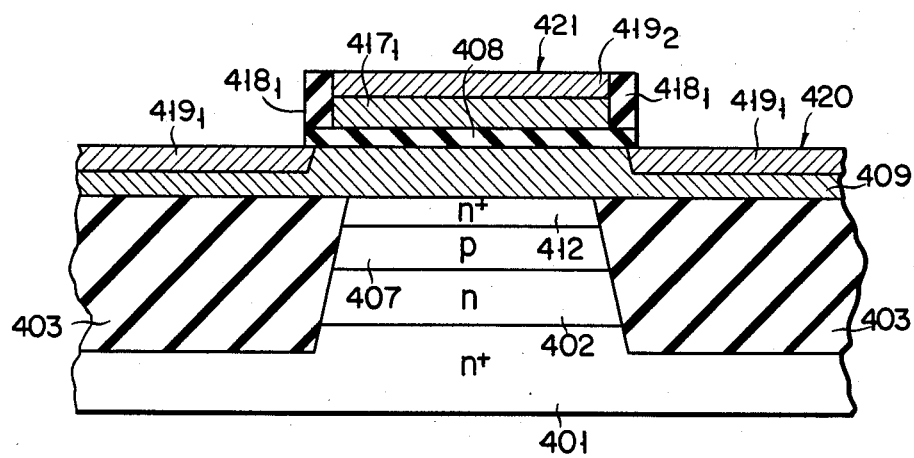
FIG. 13 is a sectional view of the semiconductor device along the line IIIX—IIIX in FIG. 12.

(vii) Thermal oxidation was then performed at a temperature of 900° to 950° C. Second oxide films 418₁ and 418₂ of 2,000 to 3,000 Å thickness were formed on the side surfaces of the p+-type polycrystalline silicon patterns 417₁ and 417₂. Subsequently, exposed parts of the first and second silicon nitride film patterns 408, 416₁ and 416₂ were etched by hot phosphoric acid to expose part of the n+-type polycrystalline silicon pattern 409 and all of the p+-type polycrystalline silicon patterns 417₁ and 417₂. The first silicon nitride film 408 which was formed on the n+-type polycrystalline silicon pattern 409 acted as the collector wiring and which was formed below the p+-type polycrystalline silicon pattern 417₁ acted as the base wiring remained to act as an insulating film between the collector wiring and the base wiring. A platinum film was then deposited to cover the entire surface to a thickness of 500 to 1,500 Å and was annealed in an atmosphere of $N_2$ at a temperature of 500° to 600° C. Surface layers of the n+-type polycrystalline silicon pattern 409 and the p+-type polycrystalline silicon patterns 417₁ and 417₂ contacted the platinum film and reacted therewith. Thus, platinum silicide films 419₁, 419₂ and 419₃ were formed. The residual platinum on the thick silicon oxide film 403, the thermal oxide film pattern 404 and the second oxide films 418$_1$ and 418$_2$ was etched by nitrohydrochloric acid (HCl: HNO$_3$=3:1). Thus, a collector wiring 420 having the platinum silicide film 419$_1$ in its surface layer was formed. A base wiring 421 was formed which had the platinum silicide film 419$_2$ and which contacted the outer base region 414 through the contact hole 413$_1$. Similarly, an injector wiring 422 was formed which had the platinum silicide film 419$_3$ in its surface layer and which contacted the injector region 415 through the contact hole 413$_2$ Thus, an I$^2$L was prepared (FIGS. 11g, 12, and 13). FIG. 12 is a plan view of the I$^2$L shown in FIG. 11g and FIG. 13 is a sectional view thereof along the line IIIX—IIIX in FIG. 12.

Since a semiconductor device comprising the I$^2$L gate shown in FIGS. 11g, 12 and 13 has the platinum silicide films 419$_1$ to 419$_3$ on the collector, base and injector wirings 420, 421 and 422, respectively, the wiring resistance is decreased greatly. Further, the width of the collector wiring 420 is as small as about 1 to 2 μm although it has been difficult to perform fine patterning of the collector wiring in consideration of the wiring resistance. As a result, fine patterning of the I$^2$L gate is achieved. Thus manufactured I$^2$L gate has a high switching speed and a wide operational range. Hillocks (projections) may not be formed on the platinum silicide films 419$_1$ to 419$_3$ upon annealing at a temperature of 500° to 600° C. and the collector, base and injector wirings 420, 421 and 422 are covered with the platinum silicide films 419$_1$ to 419$_3$. Therefore, if an insulating film, such as a silicon oxide film and a phosphorus silicide glass film (PSG film), which is formed by the CVD method at a temperature of 500° C. is interposed between the wiring layers, an excellent multi-layer structure can be obtained. Further, an excessive mask alignment space need not be formed to align the n$^+$-type collector region 412 with the contact hole 406 of the silicon nitride film 405, resulting in fine patterning. Similarly, an extra base region need not be formed in a jumper wiring, so that the ratio of the junction area between the collector and the base to the junction area between the emitter and the base comes close to 1.

Further, according to the method described above, since the silicon nitride film 405 is formed on the n-type silicon epitaxial layer 402 and the first silicon nitride pattern 408 is formed on the n$^+$-type polycrystalline silicon film pattern 409, thermal oxidation can be performed for a predetermined period of time on the side surfaces of the n$^+$-type polycrystalline silicon pattern 409. As a result, the first oxide film 411 insulates the side surfaces of the n$^+$-type polycrystalline silicon pattern 409 from the outside, so that short-circuiting between the collector and the base is prevented. The contact hole 413$_1$ is formed in a self-aligned manner by etching the silicon nitride film 405. The base wiring 421 has a structure in which the platinum silicide film 419$_2$ is formed on the p$^+$-type polycrystalline silicon pattern 417$_1$, resulting in good step coverage so that disconnections due to the step formed by different film thicknesses can be prevented. Further, in a portion in which the collector wiring three-dimensionally intersects with the base wiring, the platinum silicide films 419$_1$ and 419$_2$ are formed in a self-aligned manner through the oxide film 418$_1$. The collector wiring 420 and the base wiring 421 excluding the collector region 412 can be covered with the platinum silicide films 419$_1$ and 419$_2$, the wiring resistance of which is lower than that of the impurity-doped polycrystalline silicon.

EXAMPLE 8

Figure 14A:
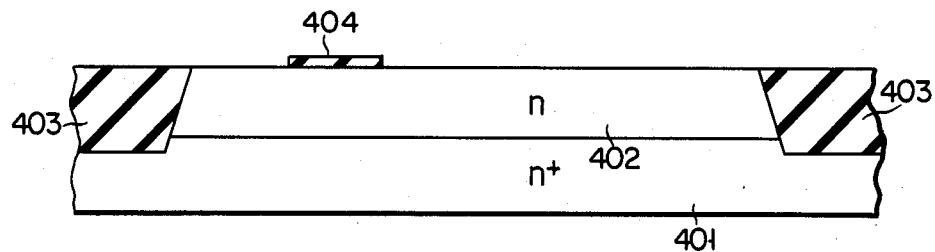
FIGS. 14a to 14e, FIGS. 15a to 15f and FIGS. 16a to 16e are sectional views for explaining the steps of manufacturing semiconductor devices according to eighth and ninth examples of the present invention, respectively.
Figure 14B:
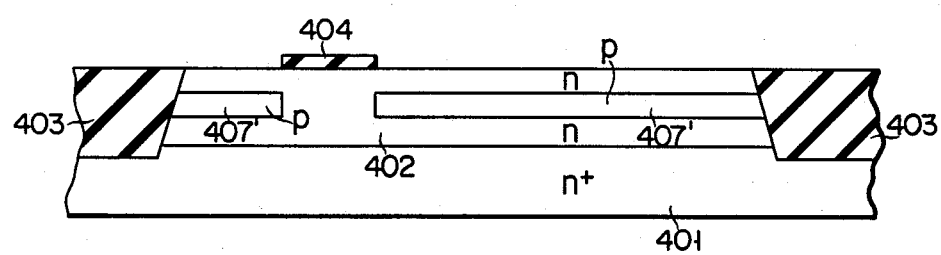

(i) An n-type silicon epitaxial layer 402 was formed on an n$^+$-type silicon substrate 401 in the same manner as in Example 7. A silicon oxide film 403 was formed in the n-type silicon epitaxial layer 402. Thereafter, a thermal oxide film pattern 404 was formed and a buffer oxide film (not shown) was then formed to cover the entire surface (FIG. 14a). Boron was then ion-implanted into the n-type silicon epitaxial layer 402 at an accelerating voltage of 200 KeV, using the thick silicon oxide film 403 and the thermal oxide film pattern 404 as masks. Boron was then activated and diffused into the n-type silicon epitaxial layer 402 to form a p-type inner base region 407' at a depth of 0.5 to 0.6 μm from the surface of the n-type silicon epitaxial layer 402. Thereafter, the buffer oxide film was etched in order to decrease damage of the n-type silicon epitaxial layer 402 (FIG. 14b).

Figure 14C:
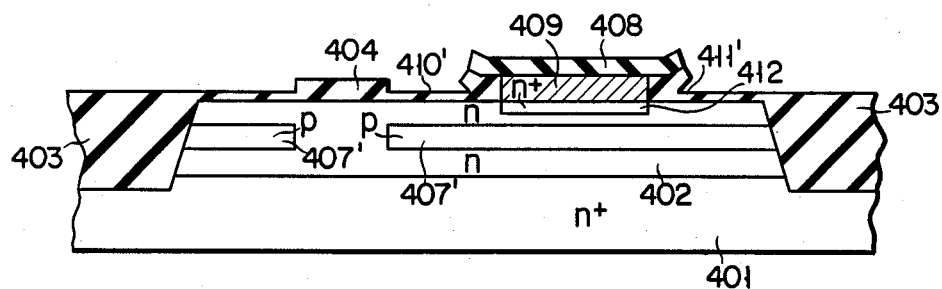

(ii) An n$^+$-type polycrystalline silicon film of 2,000 Å thickness and a silicon nitride film of 2,500 Å thickness were sequentially deposited to cover the entire surface. The silicon nitride film was patterned to form a first silicon nitride pattern 408, and the n$^+$-type polycrystalline silicon film was then patterned to form an n$^+$-type polycrystalline silicon pattern 409 which crossed over the n-type silicon epitaxial layer 402 and both ends of which faced the thick silicon oxide film 403. Wet oxidation was then performed at a temperature of 850° C. An oxide film 410' of about 700 Å thickness was formed on the exposed upper surface of the n-type silicon epitaxial layer 402. Simultaneously, a first oxide film 411' of about 3,000 Å thickness was formed on exposed side surfaces of the n$^+$-type polycrystalline silicon pattern 409. This is because that an oxide film can be deposited on a high-impurity semiconductor layer (especially, n-type semiconductor layer) several times faster than on a low-impurity semiconductor layer, depending on an impurity concentration, and that the difference in the deposition rates is increased at a low temperature. Upon thermal oxidation, an n-type impurity was then diffused from the n$^+$-type polycrystalline silicon pattern 409 into the n-type silicon epitaxial layer 402 to form an n$^+$-type collector region 412 (FIG. 14c).

Figure 14D:
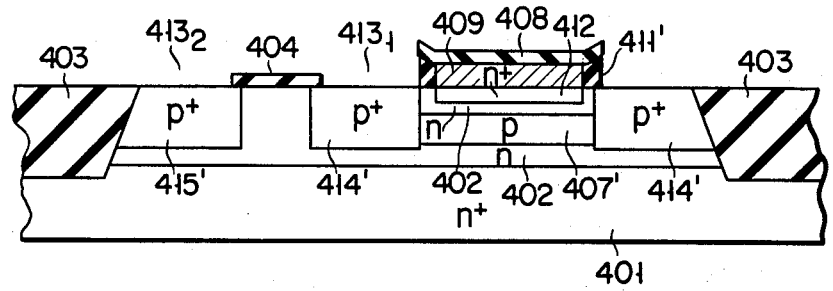
Figure 14E:
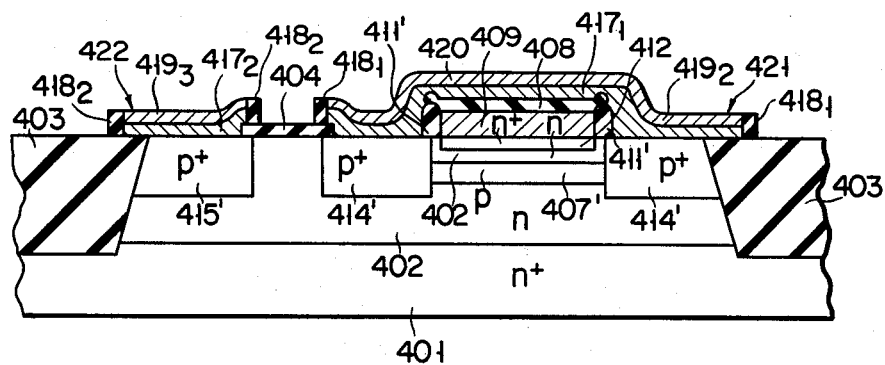

(iii) Boron was then ion-implanted in the n-type silicon epitaxial layer through a thin oxide film 410', using the thick silicon oxide film 413, the thermal oxide pattern 414 and the first silicon nitride film pattern 408 as masks. Boron was activated to form a p$^+$-type outer base region 414' and a p$^+$-type injector region 415'. The thin oxide film 410' was then selectively etched by anisotropic etching such as reactive ion etching with a Freon type etchant to form contact holes 413$_1$ and 413$_2$ for the base and the injector (FIG. 14d). At this time, the first silicon nitride film pattern 408 was slightly etched, which may be negligible. Thereafter, in the same manner as steps (vi) and (vii) in Example 7, a collector wiring 420 having a platinum silicide film (not shown) was formed. Simultaneously, a base wiring 421 having a platinum silicide film 419$_2$ and an injector wiring having a platinum silicide film 419$_3$ were formed. Thus, the I$^2$L was prepared (FIG. 14e).

According to Example 8 just described above, the same effects as in Example 7 are obtained. In addition to it, since the inner base region 407' is formed by ion implantation with a high acceleration speed, annealing at a high temperature need not be performed. As a result, if the n-type silicon epitaxial layer 402 is as thin as 1 μm, an impurity in the n+-type silicon substrate 401 may not be diffused, resulting in an excellent I²L. Further, a distance between the n+-type collector region 412 and the p+-type outer base region 414 is made large by the overhang portion of the first silicon nitride film pattern 408 and the thickness of the first oxide film 411', greatly increasing the emitter open collector supply voltage $V_{CBO}$. Further, since the n-type silicon epitaxial layer 402 of a low impurity concentration remains between the n+-type collector region 420 and the p-type inner base region 407', the dipping phenomenon is prevented and an I²L with a large current amplification factor and a small junction capacitance is obtained.

In the above example, the insulating films are formed by thermal oxidation on the side surfaces of the first and second polycrystalline silicon patterns corresponding to the n+-type polycrystalline silicon pattern and the p+-type polycrystalline silicon pattern, respectively. However, the insulating films may be etched by anisotropic etching and insulating films may be formed by the CVD method.

In the above example, a semiconductor and a method for manufacturing it may be provided wherein the wiring resistance is decreased and the switching speed is increased by converting the base and collector wirings to metal silicide in a self-aligned manner in the I²L.

EXAMPLE 9

Example 9 is a case in which the present invention is applied to the manufacture of an n-channel MOS transistor.

Figure 15A:
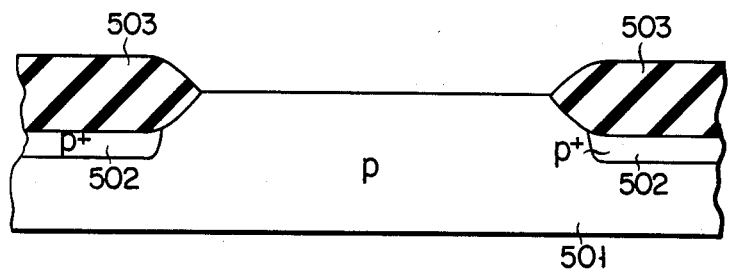
Figure 15B:
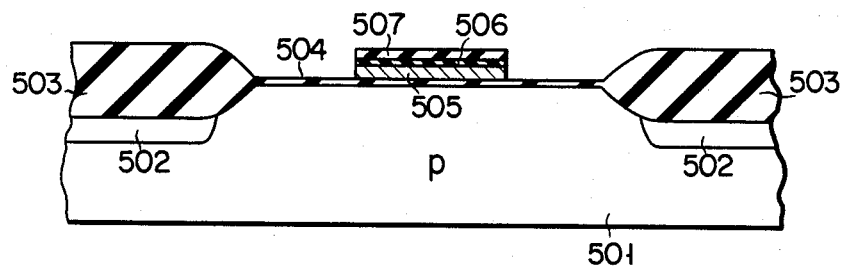

(i) As shown in FIG. 15a, a p+-type channel stopper 502 and a field isolation layer 503 were formed in a p-type semiconductor substrate 501. A gate oxide film 504 was then formed to a thickness of 400 to 1,000 Å, and a p-type impurity was then ion-implanted (not shown) on the entire surface to control the threshold voltage Vth. After an n+-type polycrystalline silicon film was deposited to cover the entire surface to a thickness of 3,000 to 4,000 Å, a CVD-Si₃N₄ film 506 of 1,000 Å thickness and a CVD-SiO₂ film of 3,000 to 5,000 Å thickness were sequentially deposited on the n+-type polycrystalline silicon film. These films were selectively patterned to form an CVD-SiO₂ film pattern 507, a CVD-Si₃N₄ film pattern 506 and an n+-type polycrystalline silicon pattern 505 (FIG. 15b).

Figure 15C:
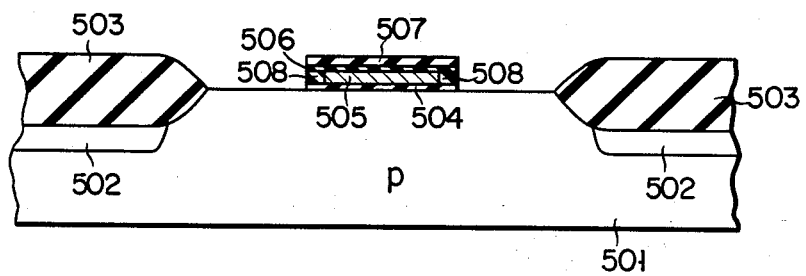

(ii) The exposed part of the gate oxide film 504 was then etched to form a gate oxide film pattern 504' as shown in FIG. 15c. The above etching technique may comprise a method for selectively etching the gate oxide film 504 by anisotropic etching such as reactive ion etching which is performed simultaneously as the formation of the polycrystalline silicon pattern 505, the CVD-Si₃N₄ film pattern 506 and the CVD-SiO₂ film pattern 507, or a method for selectively etching the gate oxide film 504, using these patterns as masks after the patterns 505, 506 and 507 are sequentially formed and annealed in an atmosphere of N₂. An oxide film 508 of 2,000 to 3,000 Å thickness was then formed on side surfaces of the polycrystalline silicon pattern 505 in a dry atmosphere of O₂ at a temperature of 700° to 900° C. Simultaneously, an oxide film (not shown) of 300 to 700 Å thickness was formed on the p-type semiconductor substrate. Thereafter, the oxide film was etched by the RIE method in a self-aligned manner to expose prospective source and drain regions of the p-type semiconductor substrate 501 (FIG. 15c).

After the source and drain regions are formed by ion implantation with arsenic, the side surfaces of the polycrystalline silicon pattern 505 may be oxidized and contact holes for the source and the drain may be formed by photoetching.

Figure 15D:
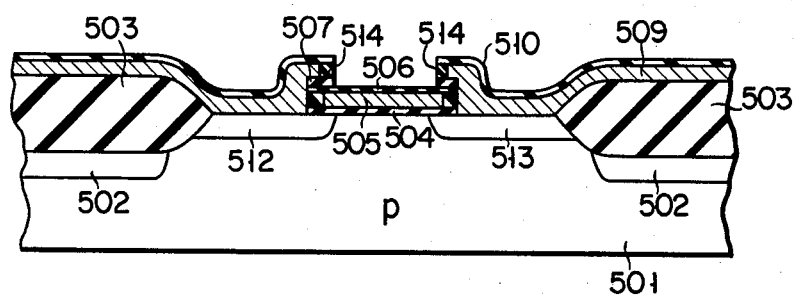

(iii) After an arsenic-doped polycrystalline silicon film of 3,000 to 4,000 Å thickness and a CVD-Si₃N₄ film of 1,000 Å thickness were formed to cover the entire surface, these films were patterned to form an arsenic-doped polycrystalline silicon patterns 509 and a CVD-Si₃N₄ film pattern 510. Upon alignment in photoetching, wirings for a source region 512 and a drain region 513 which correspond to polycrystalline silicon patterns 509 were formed. Although an alignment error may occur to cause partial exposure of the substrate, no problem is presented since arsenic has been ion-implanted. The CVD-SiO₂ film 507 on the gate region corresponding to the polycrystalline silicon pattern 505 was etched using the contact hole formed on the CVD-Si₃N₄ film 506 and the polycrystalline silicon pattern 509, and a thermal oxide film 514 was then formed on the side surfaces of the polycrystalline silicon pattern 509. Simultaneously, the source region 512 and the drain region 513 were formed, as shown in FIG. 15d.

Figure 15E:
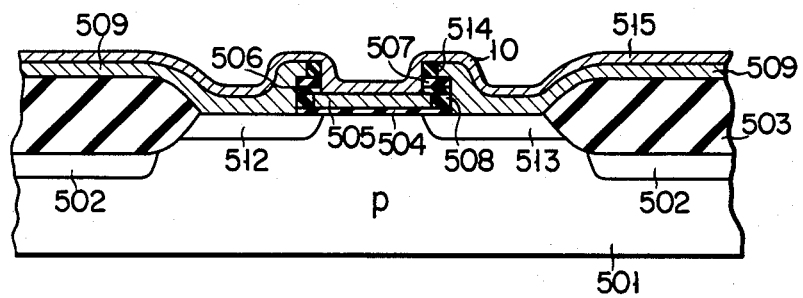

(iv) The CVD-Si₃N₄ film patterns 506 and 510 were simultaneously etched by dry etching using hot phosphoric acid or a Freon type etchant at a temperature of 160° C., a platinum film 515 was deposited to cover the entire surface to a thickness of 500 to 1,000 Å (FIG. 15e).

Figure 15F:
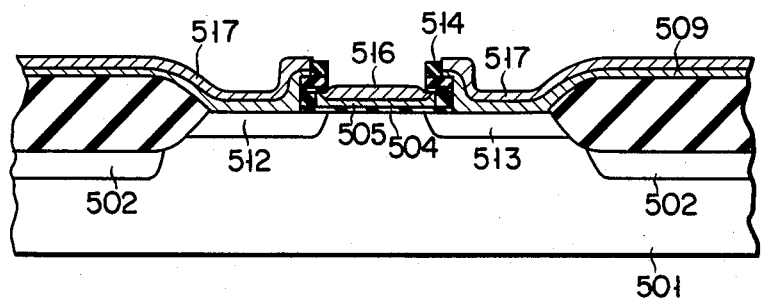

(v) The wafer was annealed in an atmosphere of N₂ at a temperature of 500° to 600° C. The polycrystalline silicon patterns 505 and 509 reacted with the platinum film 515 and were converted to platinum silicide. Thus, platinum silicide films were formed, while platinum on the oxide film 514 remained unconverted. The residual platinum was then etched by nitrohydrochloric acid. Thus, the platinum silicide wirings 516 and 517 were formed on the polycrystalline silicon patterns 505 and 509 in a self-aligned manner (FIG. 15f).

In Example 9, the gate, source and drain wirings have metal silicide films thereon, respectively, resulting in a low wiring resistance.

The thickness of the platinum silicide film is determined by that of platinum deposited on the polycrystalline silicon patterns. For example, if a platinum film of 500 Å thickness is annealed in an atmosphere of N₂ at a temperature of 550° C., a platinum silicide film of about 1,000 Å thickness may be formed. Even if all the polycrystalline silicon film is not converted to platinum silicide, no problem occurs. The wiring resistance (sheet resistance) in Example 9 was 2 ohms/□.

After the oxide film 514 in FIG. 15d is formed, phosphorus gettering may be performed as needed. Further, in the above example, the oxide films 508 and 514 are formed by thermal oxidation. However, a method shown in Example 10 below may also be utilized.

EXAMPLE 10

Figure 16A:
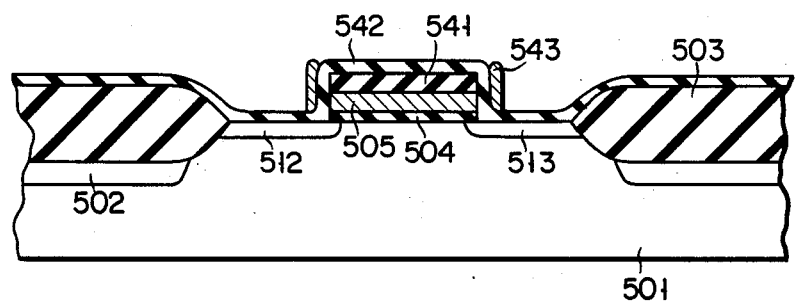

As shown in FIG. 16a, a p+-type channel stopper 502 and a field isolation layer 503 were formed in a p-type semiconductor substrate 501. A gate oxide film, an n+-type polycrystalline silicon film, and a CVD-Si₃N₄ film were sequentially formed to cover the entire surface. Thereafter, these films were sequentially etched to form a CVD-Si₃N₄ film pattern 541, an n+-type polycrystalline silicon pattern 505 and a gate oxide film pattern 504. A second CVD-SiO₂ film 542 of 2,000 to 3,000 Å thickness was deposited and annealed to improve the film quality. An undoped polycrystalline silicon film was formed on side surfaces of the polycrystalline silicon pattern 505 though the second CVD-SiO₂ film 542 to form a polycrystalline silicon wall 543 by utilizing the RIE method.

Figure 16B:
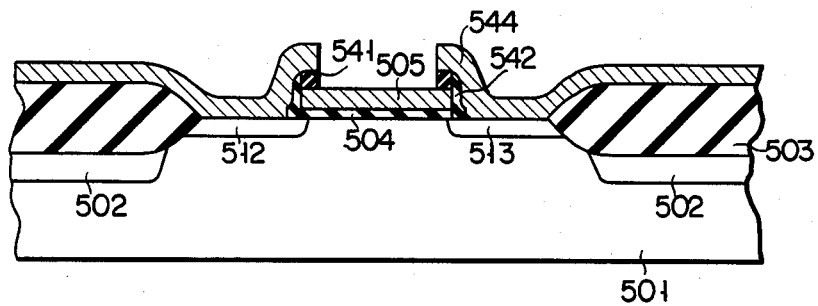
Figure 16C:
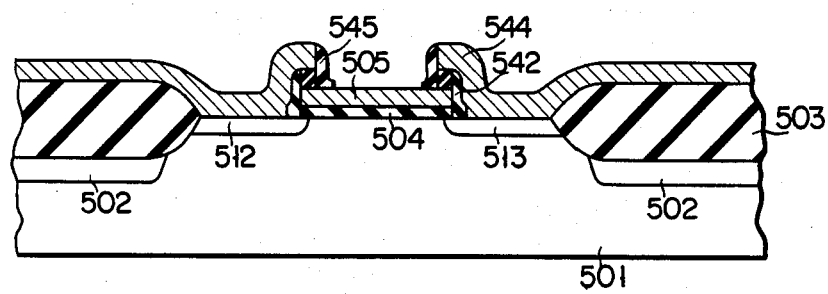

The second CVD-SiO₂ film 542 was selectively etched using the polycrystalline silicon wall 543 as a mask to expose the first CVD-SiO₂ film pattern 541, a source region 512 and a drain region 513. After the polycrystalline silicon wall 543 was etched (or need not be etched), an n⁺-type polycrystalline silicon film was deposited to cover the entire surface and patterned to form an n⁺-type polycrystalline silicon patterns 544. Simultaneously, the CVD-Si₃N₄ film pattern 541 on the gate polycrystalline silicon pattern 505 was etched, as shown in FIG. 16b. After a CVD-Si₃N₄ film 545 was deposited to cover the entire surface, an undoped polycrystalline silicon film was deposited thereon. A polycrystalline silicon wall was then formed on side surfaces of the polycrystalline silicon patterns 544 through the CVD-Si₃N₄ film, which was not illustrated. Thereafter, the CVD-Si₃N₄ film 545 was selectively formed on the side surfaces of the polycrystalline silicon patterns 544, using the polycrystalline silicon wall as a mask, and the polycrystalline silicon wall was then etched (FIG. 16c). Therefore, the source and drain regions corresponding to the n⁺-type polycrystalline silicon patterns 544 and the gate electrode corresponding to the n⁺-type polycrystalline silicon pattern 505 were isolated in a self-aligned manner through the CVD-Si₃N₄ film 545. Thus, the insulating films (CVD-Si₃N₄ films 542 and 545) were formed without thermally oxidizing the n⁺-type polycrystalline silicon patterns 505 and and 545.

Figure 16D:
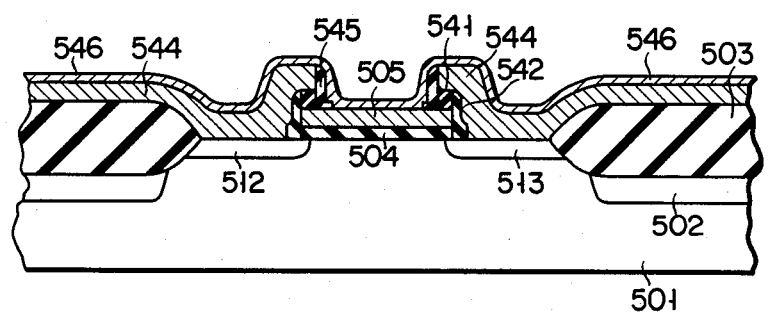
Figure 16E:
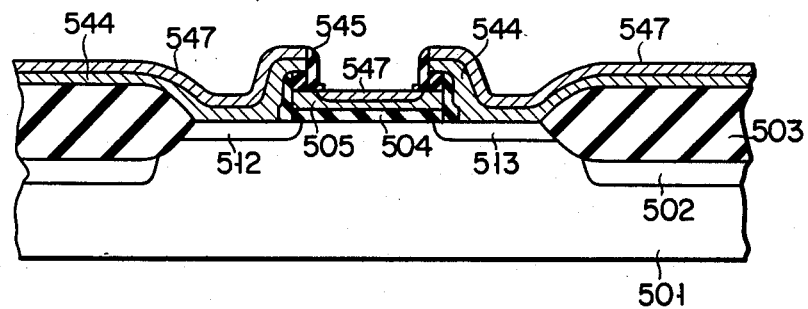

A platinum film 546 of 500 Å thickness was deposited to cover the entire surface (FIG. 16d) and annealed in an atmosphere of N₂ at a temperature of 550° C. The polycrystalline silicon patterns 505 and 544 reacted with the platinum film 546 and were converted to platinum silicide so that platinum silicide films 547 were formed. Platinum remained on the CVD-Si₃N₄ film 143 was etched by nitrohydrochloric acid (FIG. 16e).

EXAMPLE 11

Example 11 is a case in which the present invention is applied to the manufacture of a p-channel MOS transistor.

Figure 17A:
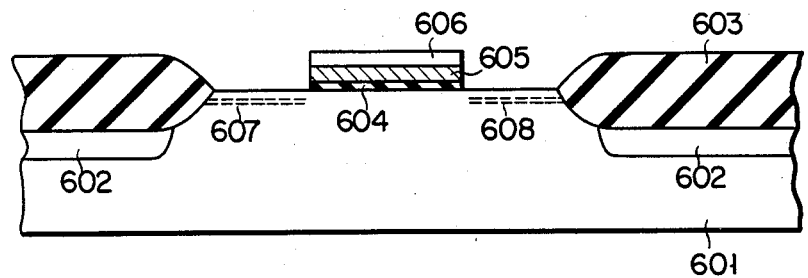
FIGS. 17a to 17b are sectional views for explaining the steps of manufacturing a semiconductor device according to a tenth example of the present invention.
Figure 17B:
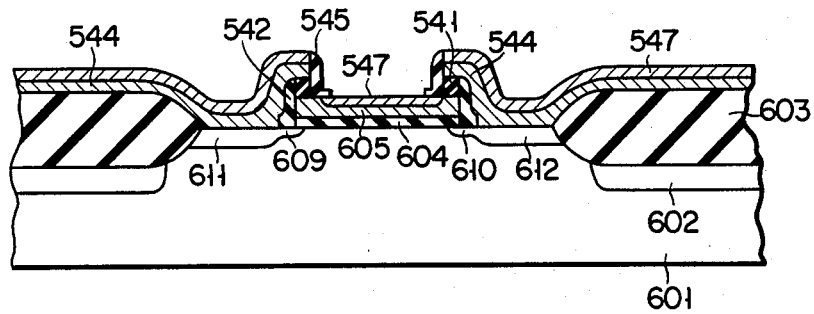

A field isolation layer 603 and an n⁺-type channel stopper 602 were formed in an n-type semiconductor substrate 601. A gate oxide film pattern 604, a p⁺-type polycrystalline silicon pattern 605 and a CVD film pattern 606 were formed on the surface of the n-type semiconductor substrate 601 in the order named. P-type impurity ions 607 and 608 were ion-implanted to a small depth at a dose of 1×10¹² to 1×10¹³ cm⁻² using the patterns 604, 605 and 606 as masks, as shown in FIG. 17a. In the same manner as in Example 10, CVD films 541, 542 and 543, p⁺-type polycrystalline silicon patterns 544, activated regions 609 and 610 into which the p-type impurity ions were doped to a high concentration, and diffusion layers 611 and 612 into which the p-type impurity was diffused to a high concentration from the activated regions 609 and 610 were formed. The platinum silicide films 547 were then formed for the source, drain and gate of the MOS transistor in the same manner as in Example 10 (FIG. 17b).

EXAMPLE 12

Example 12 is a case in which a method in Example 10 is applied to the manufacture of a bipolar transistor.

Figure 18:
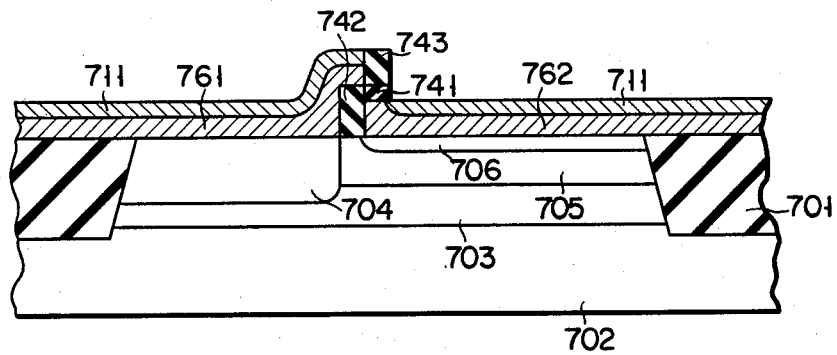
FIG. 18 is a sectional view of a p-channel MOS transistor to which the present invention applied.

Referring to FIG. 18, reference numeral 702 denotes an n⁺-type buried layer; 703, an n-type epitaxial layer; and 701, a field isolation layer. A p-type semiconductor layer 705 which was an inner base was formed in the n-type epitaxial layer 703.

The n-type polycrystalline silicon pattern 762 and a CVD film pattern 741 were selectively formed, and a CVD film 742 was formed at an end face of the n-type polycrystalline silicon pattern 762. Simultaneously, an n⁺-type semiconductor layer 706 corresponding to the emitter region was formed. Thereafter, a p-type impurity was selectively ion-implanted to a high concentration in the epitaxial layer 703 using the patterns 762 and 741 as masks to form a p⁺-type semiconductor layer 704. A p⁺-type polycrystalline silicon film was deposited and patterned to form a p⁺-type polycrystalline silicon pattern 761. A CVD-film 743 was selectively formed on side surfaces of the p⁺-type polycrystalline silicon pattern 761. Simultaneously, the CVD film 741 was etched to expose the surfaces of the p⁺-type polycrystalline silicon pattern 761 and the n⁺-type polycrystalline silicon pattern 762. In the same manner as described in the above examples, platinum silicide films 711 were formed to obtain a bipolar transistor.

What is claimed is:

1. A method for manufacturing a semiconductor device, comprising the steps of:
   (a) forming a first conductive layer of polycrystalline silicon or amorphous silicon on a field insulating layer on a semiconductor substrate;
   (b) forming a first indulating film of an antioxidant insulating material on said first conductive layer;
   (c) selectively etching said first insulating film to form a plurlaity of first insulating patterns;
   (d) selectively etching said first conductive layer to form a plurality of first conductive patterns by using said first insulating patterns as masks in such a manner that sides of said first conductive patterns are overhung by said first insulating patterns;
   (e) oxidizing the sides of said first conductive patterns to form second insulating films on the sides of said first conductive patterns;
   (f) forming a second conductive layer of polycrystalline silicon or amorphous silicon on surfaces of said field insulating layer, said first insulating patterns, and said second insulating films;
   (g) forming a third insulating film of an antioxidant insulating material on said second conductive layer;
   (h) selectively etching said third insulating film to form a plurality of third insulating patterns and to expose part of said second conductive layer, each of said third insulating patterns being formed between said first insulating patterns neighboring to said third insulating patterns;
   (i) selectively etching said second conductive layer to form a plurality of second conductive patterns by using said third insulating patterns as masks in such a manner that the sides of said second conductive patterns are overhung by said third insulating patterns to expose surfaces of said first insulating patterns;

(j) oxidizing the exposed sides of said second conductive patterns to form fourth insulating films on the sides of said second conductive patterns;

(k) etching said exposed first insulating patterns and third insulating patterns by using said fourth insulating films as masks in a self-aligned manner to expose surfaces of said first conductive patterns and second conductive patterns;

(l) forming a high-melting point metal on the exposed surfaces of the first and second conductive patterns; and (m) annealing said high-melting point metal, first and second conductive patterns to convert said first and second conductive patterns into metal silicide in a self-aligned manner.

2. A method according to claim 1, wherein said first and third insulating films are made of a material which allows a selective etching with respect to said fourth insulating film formed in step (j).

3. A method according to claim 1, wherein said high-melting point metal is platinum.

4. A method according to claim 1, wherein said antioxidant insulating material is silicon nitride.

* * * * *